United States Patent
Ono et al.

(10) Patent No.: US 8,692,255 B2
(45) Date of Patent: Apr. 8, 2014

(54) SEMICONDUCTOR ELEMENT, METHOD FOR MANUFACTURING SAME, DISPLAY DEVICE, AND ELECTRONIC DEVICE

(75) Inventors: Hideki Ono, Tokyo (JP); Ryuto Akiyama, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/495,820

(22) Filed: Jun. 13, 2012

(65) Prior Publication Data

US 2012/0319116 A1    Dec. 20, 2012

(30) Foreign Application Priority Data

Jun. 20, 2011  (JP) ................. 2011-136492
Dec. 21, 2011  (JP) ................. 2011-279240

(51) Int. Cl.
*H01L 29/04*    (2006.01)
(52) U.S. Cl.
USPC ............. 257/59; 257/72; 257/40; 257/353; 257/E51.006; 438/82; 438/98; 438/149

(58) Field of Classification Search
USPC .......... 257/59, 72, 40, 353, E51.006; 438/82, 438/98, 149
See application file for complete search history.

(56) References Cited

U.S. PATENT DOCUMENTS

2006/0046339 A1* 3/2006 Seo et al. ................ 438/57
2010/0264410 A1* 10/2010 Nomoto et al. ........... 257/40

OTHER PUBLICATIONS

Dimitrakopoulos et al., "Organic Thin Film Transistors for Large Area Electronics," Advanced Materials, vol. 14, Issue 2, Jan. 16, 2002, pp. 99-117 (19 pages).

* cited by examiner

*Primary Examiner* — Tu-Tu Ho
(74) *Attorney, Agent, or Firm* — Sheridan Ross P.C.

(57) ABSTRACT

A semiconductor element includes: an organic semiconductor layer; an electrode disposed on the organic semiconductor layer so as to be in contact with the organic semiconductor layer; and a wiring layer formed separately from the electrode and electrically connected to the electrode.

18 Claims, 30 Drawing Sheets

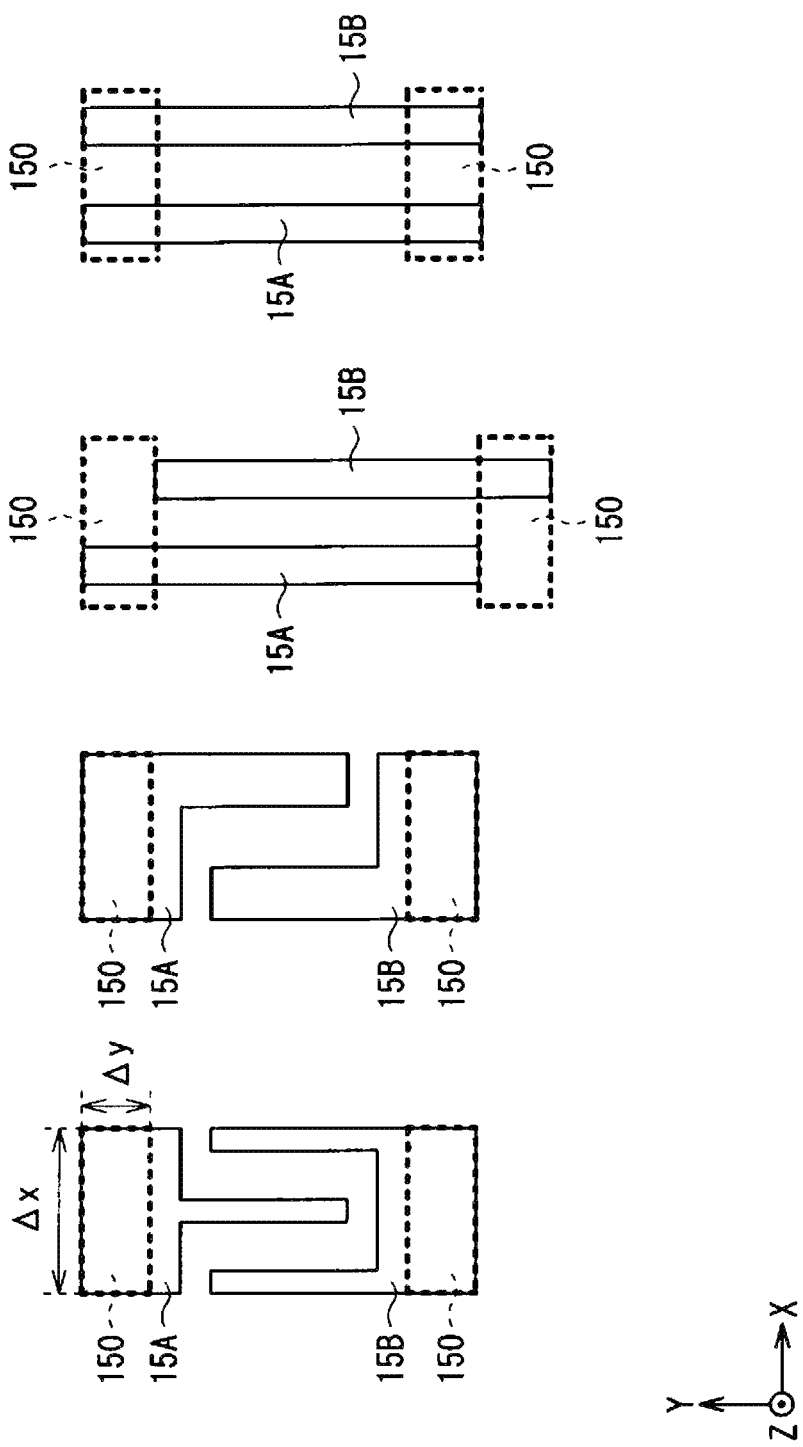

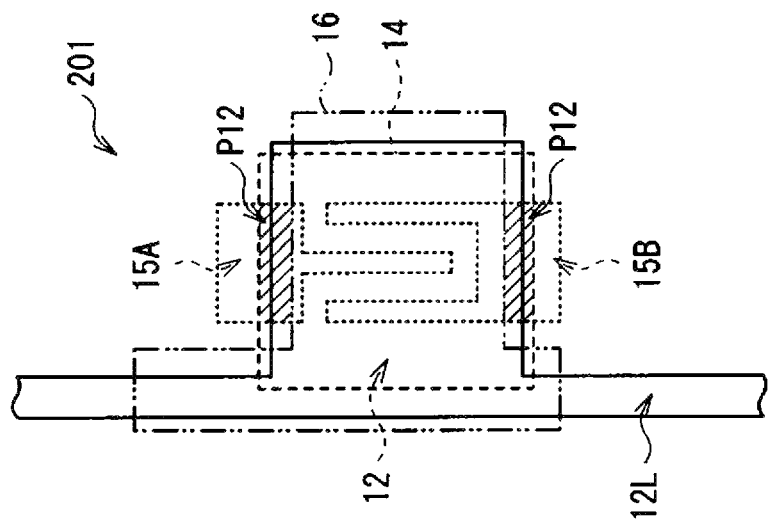
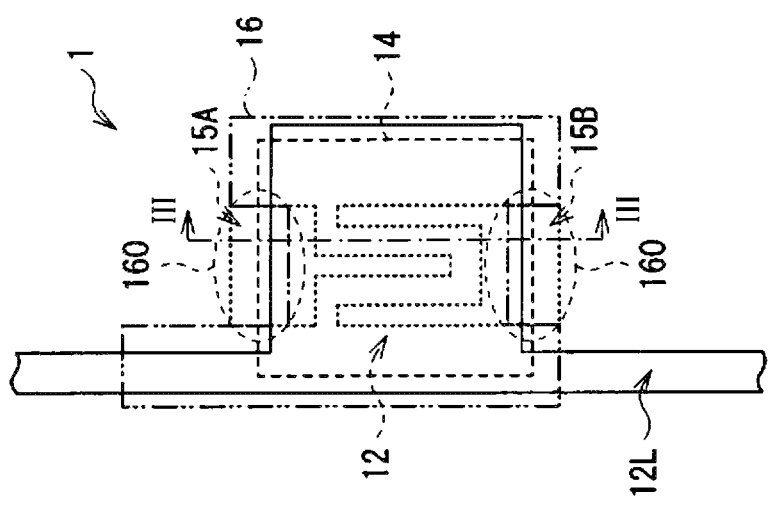
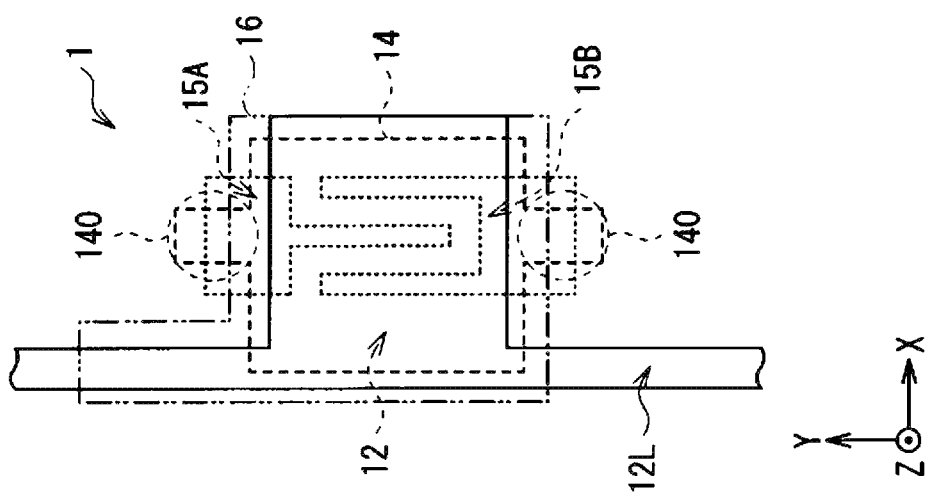

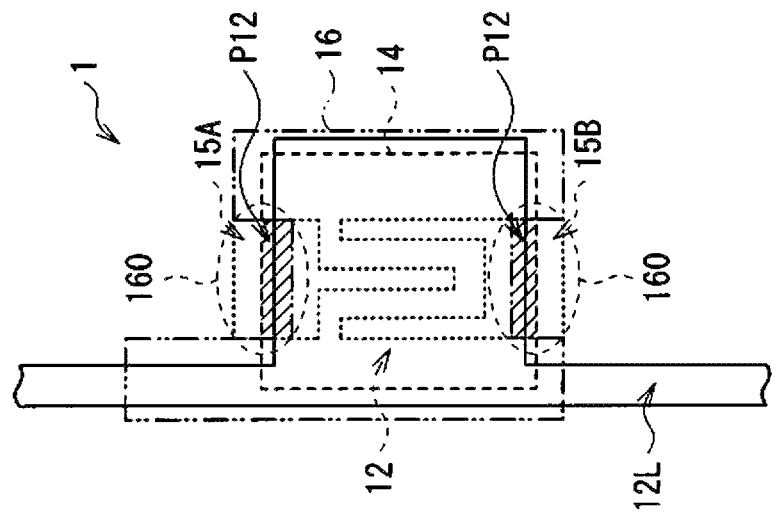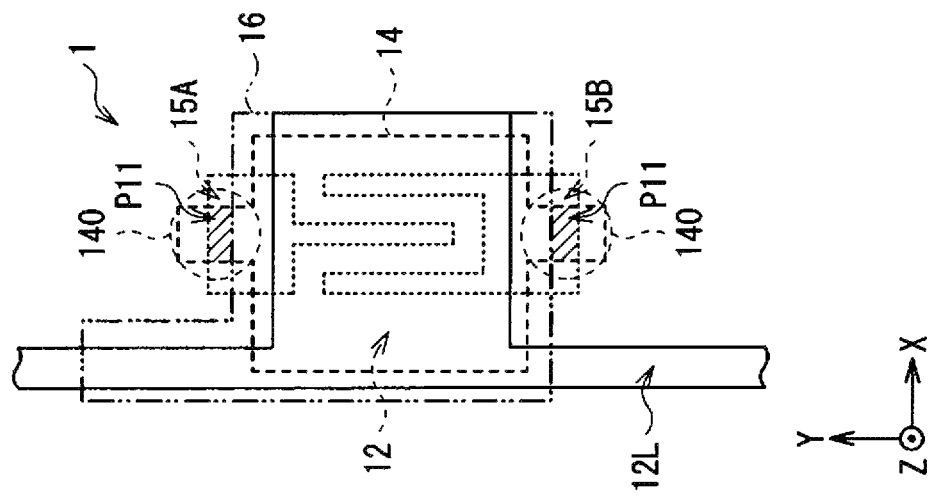

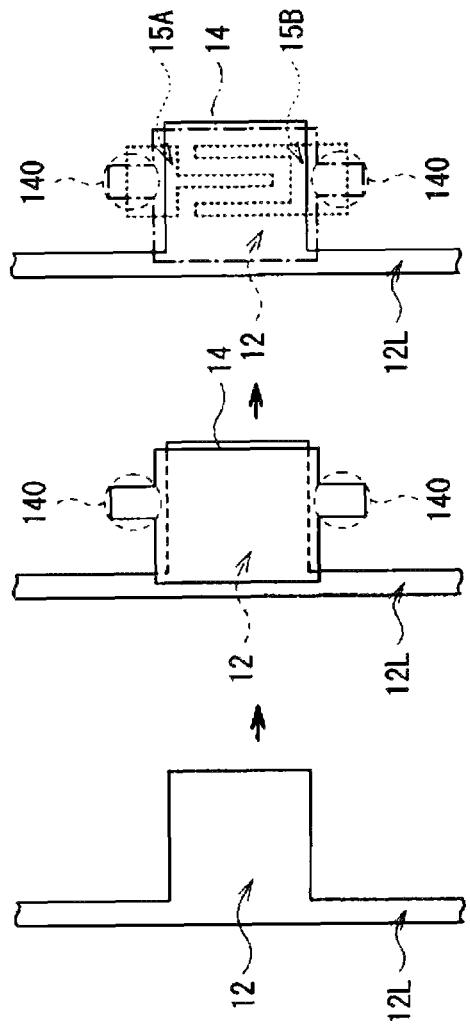
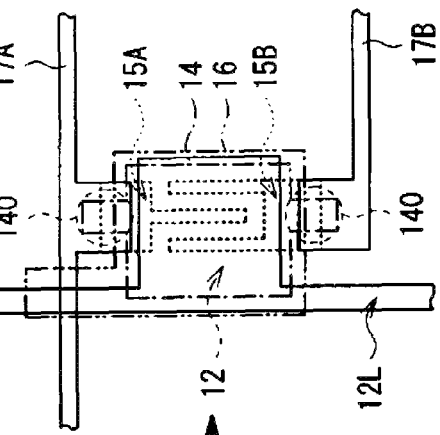
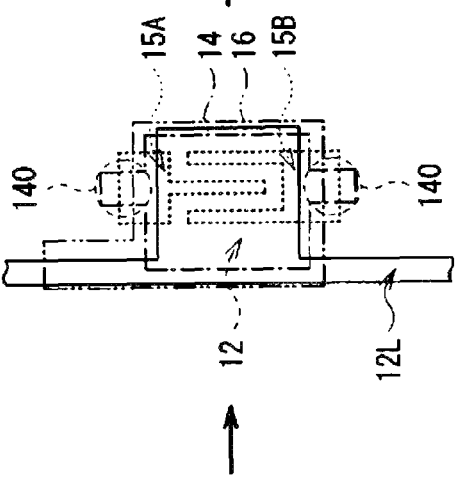

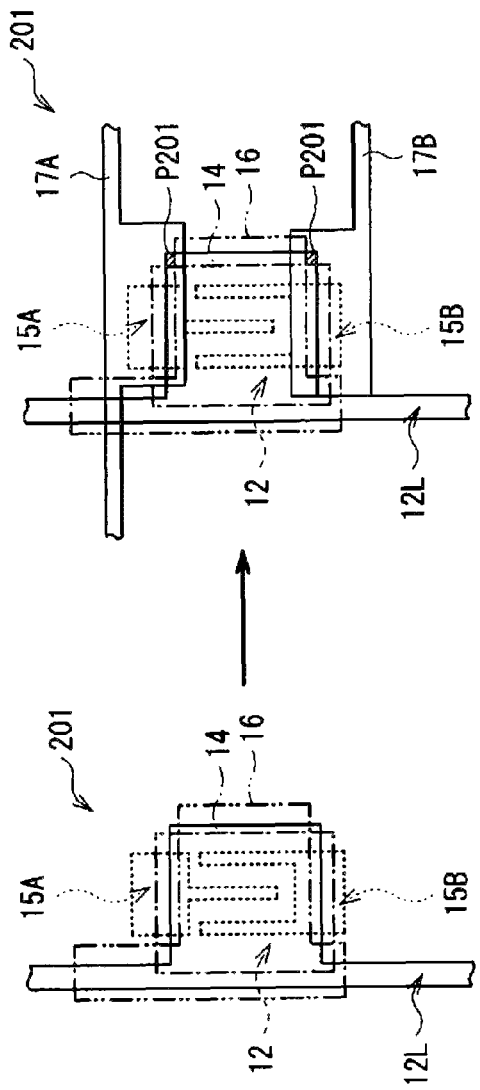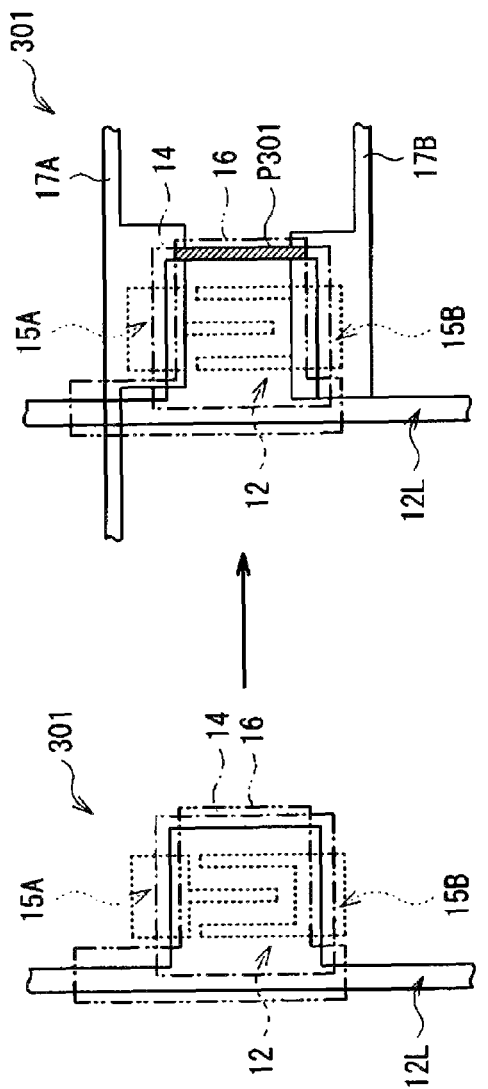
FIG. 7A
FIG. 7B

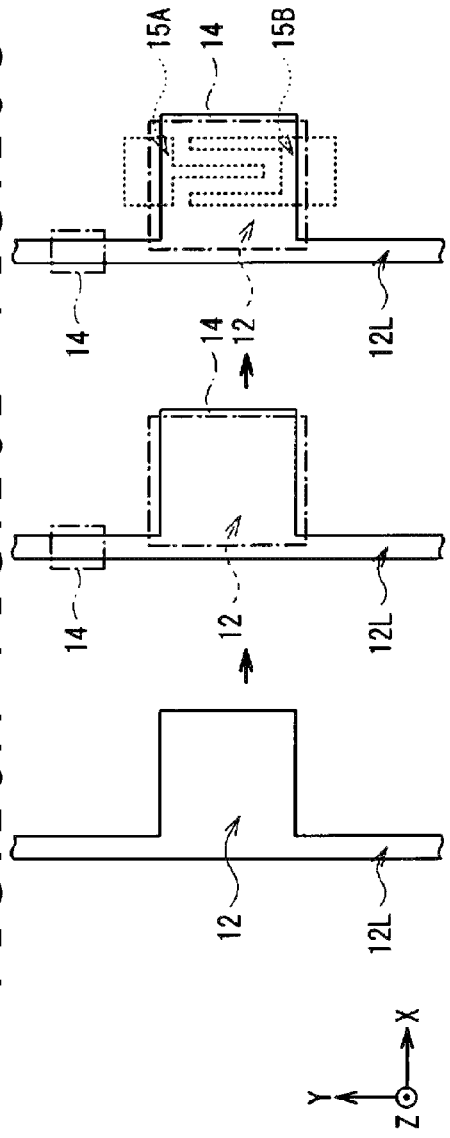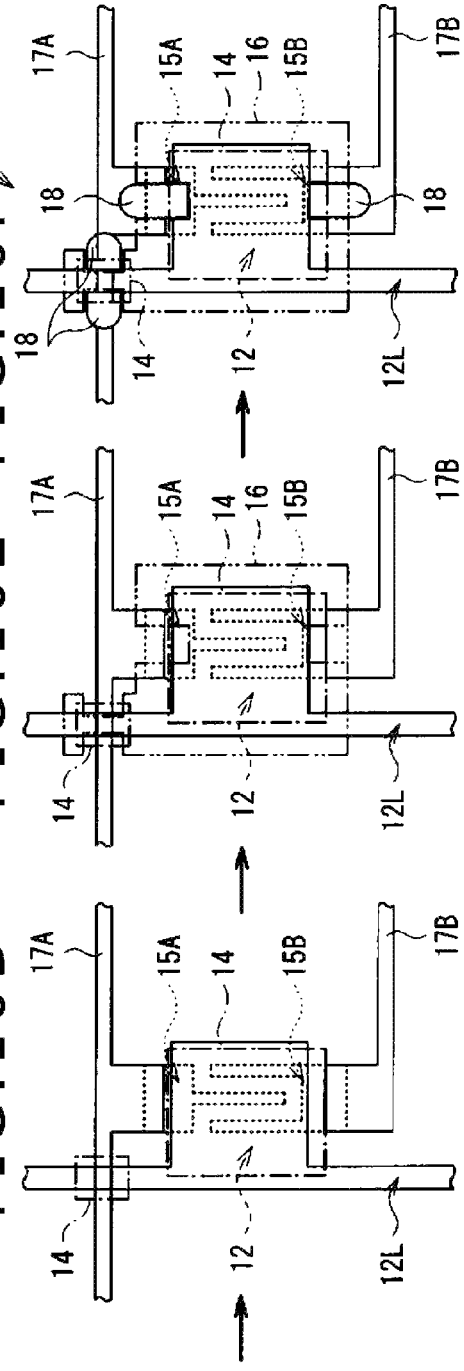

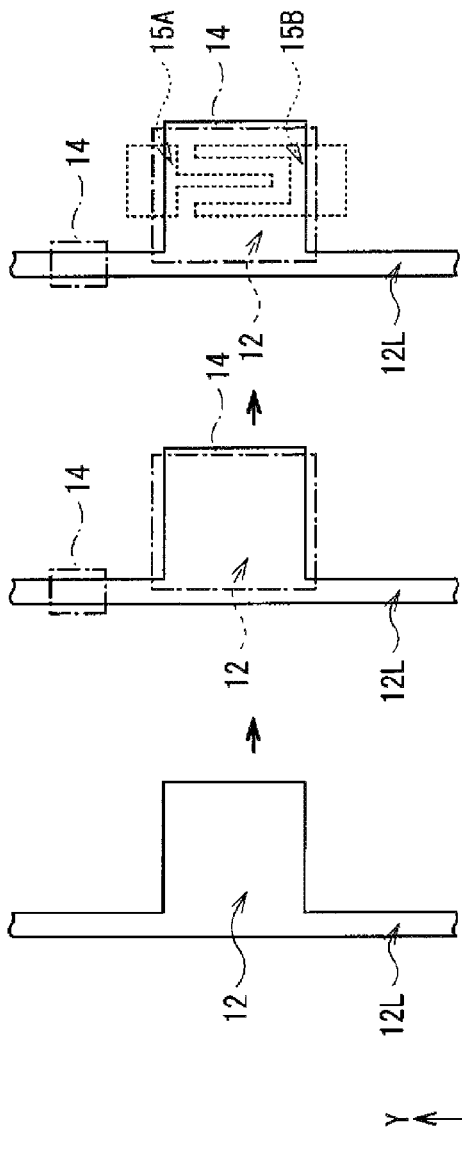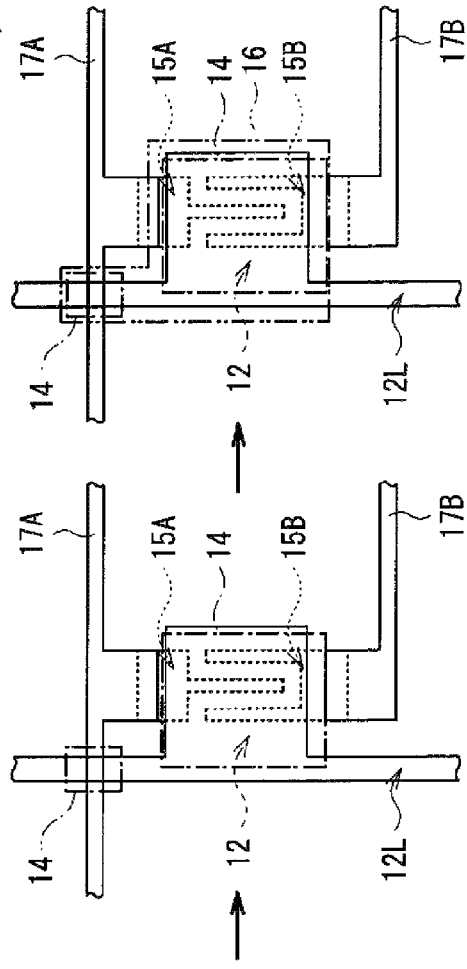

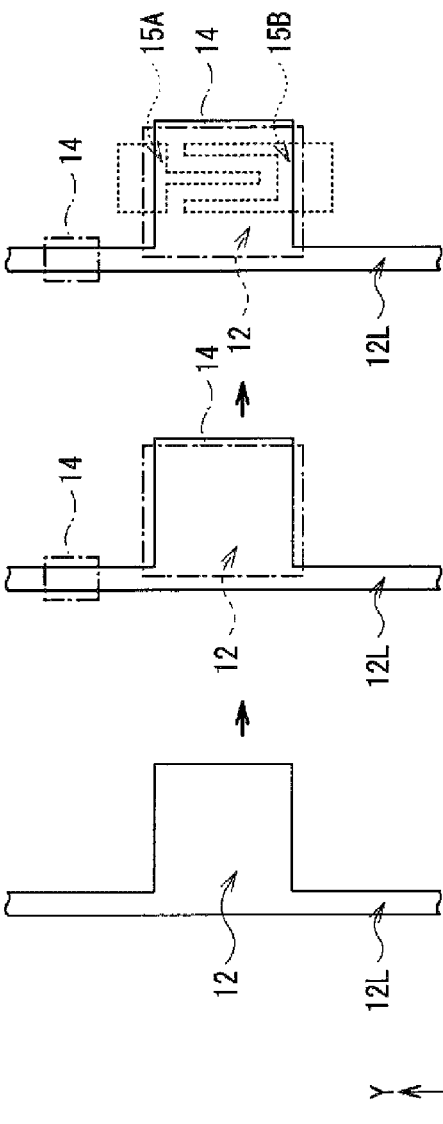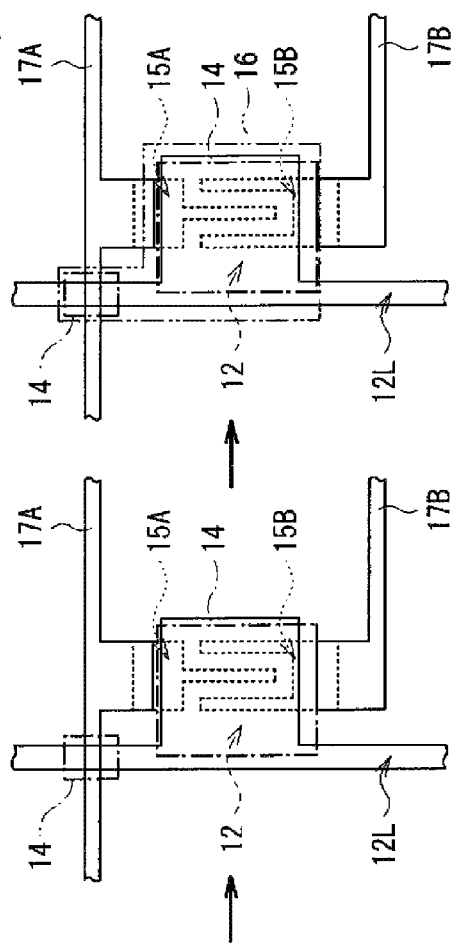

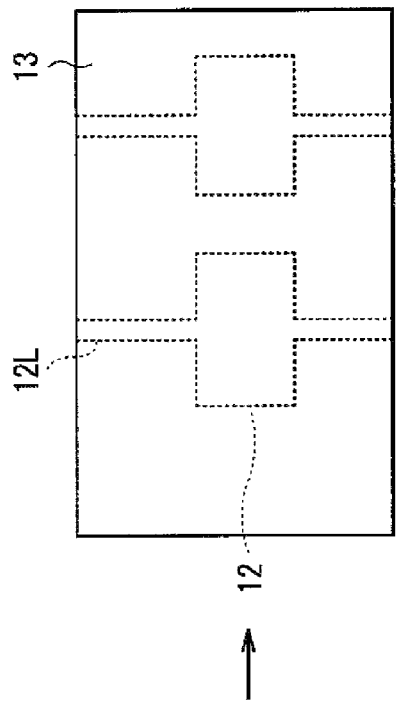
FIG.14A
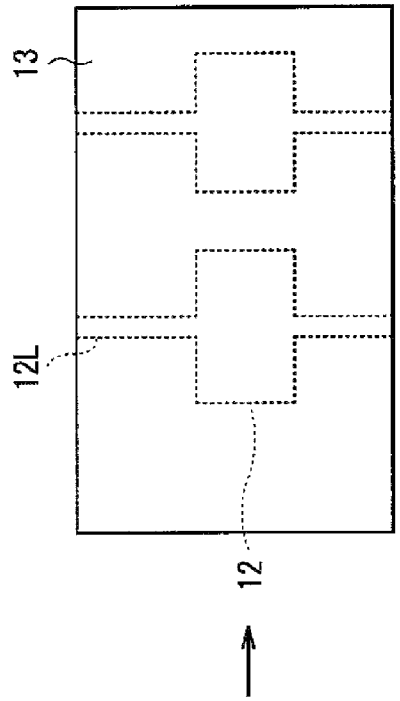
FIG.14B
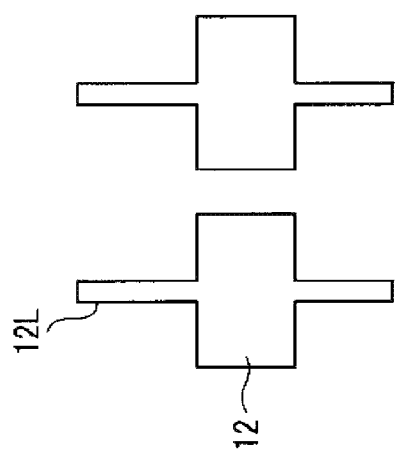
FIG.14C
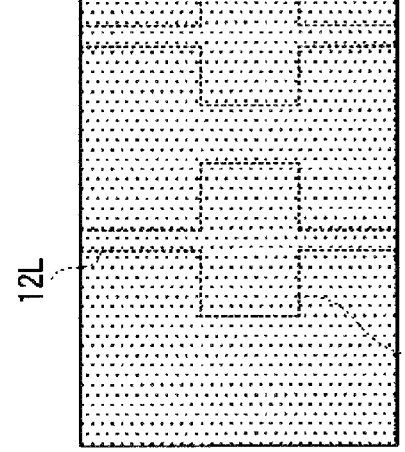
FIG.14D
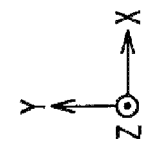

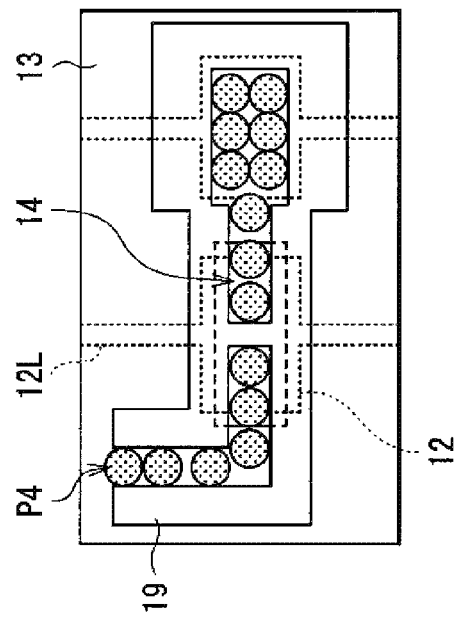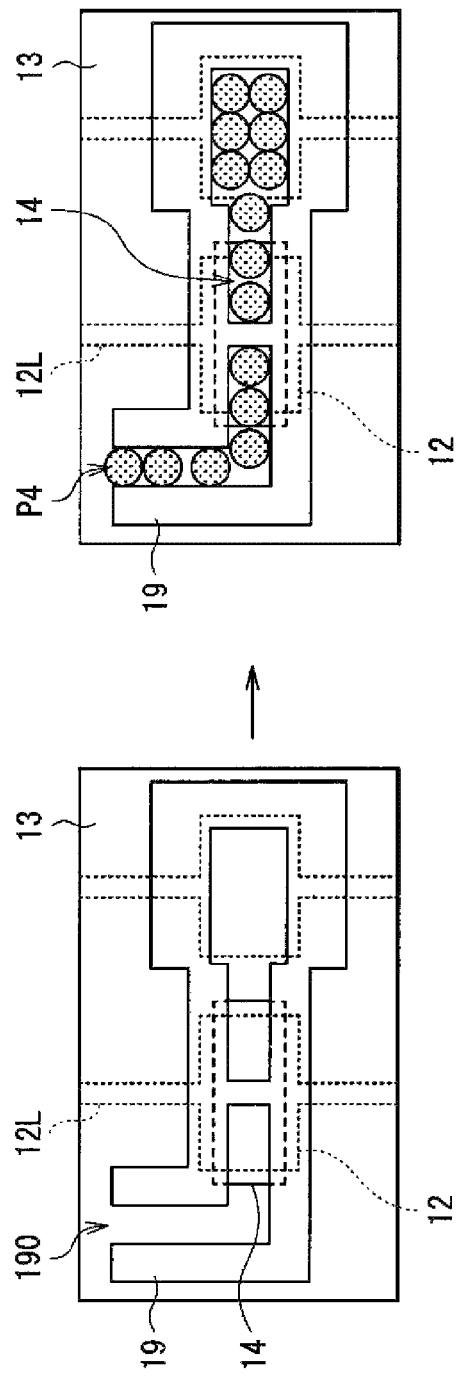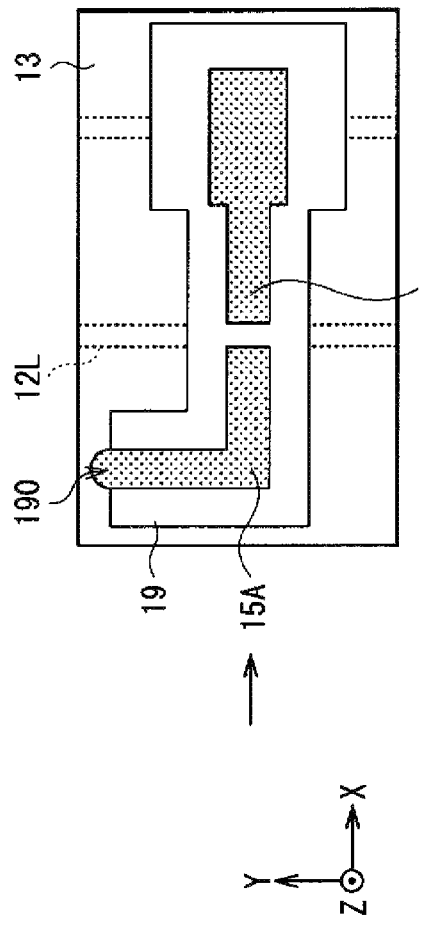

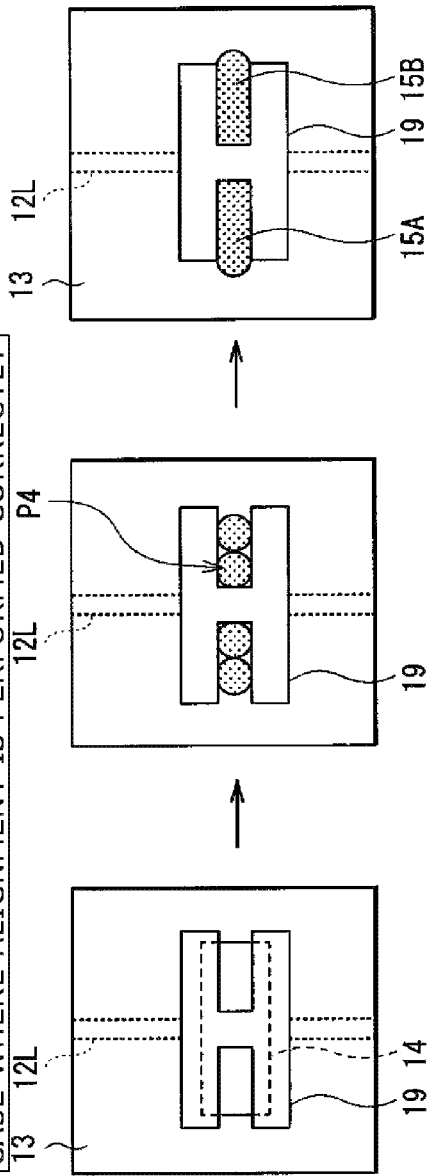
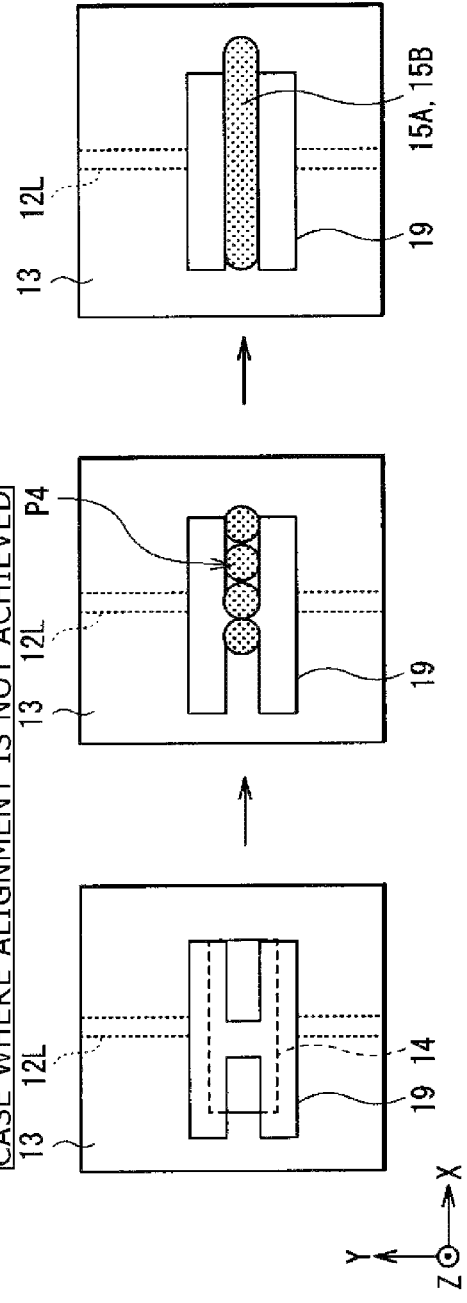
FIG.15A
FIG.15B

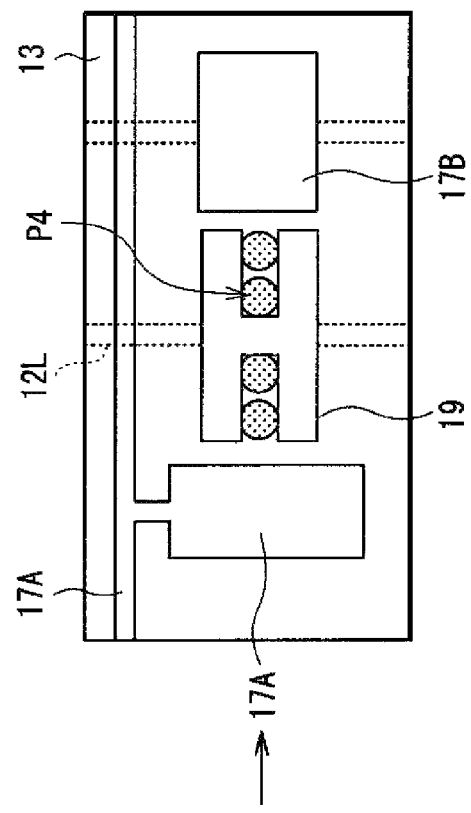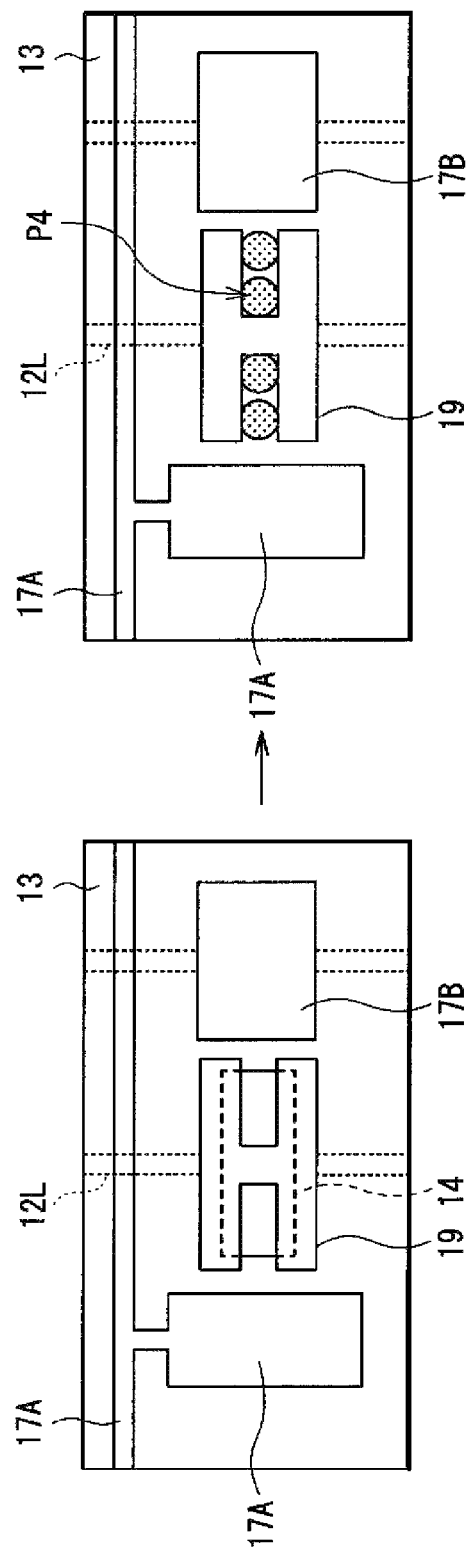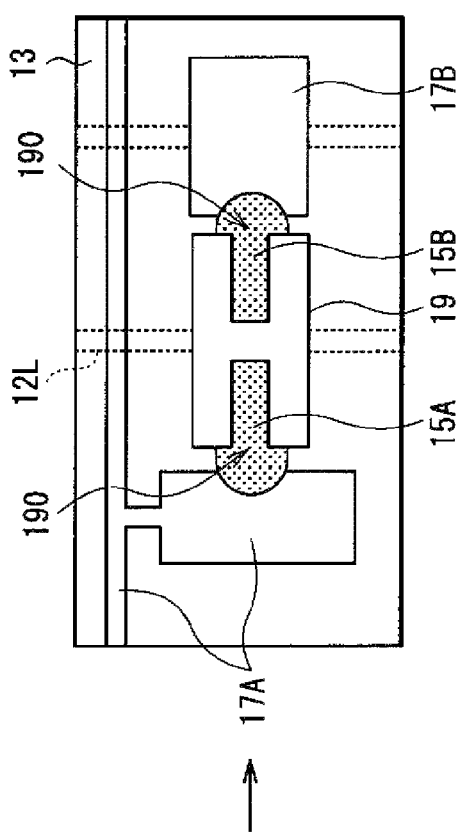

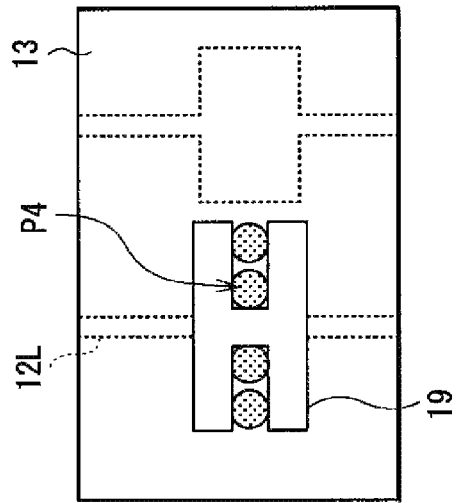
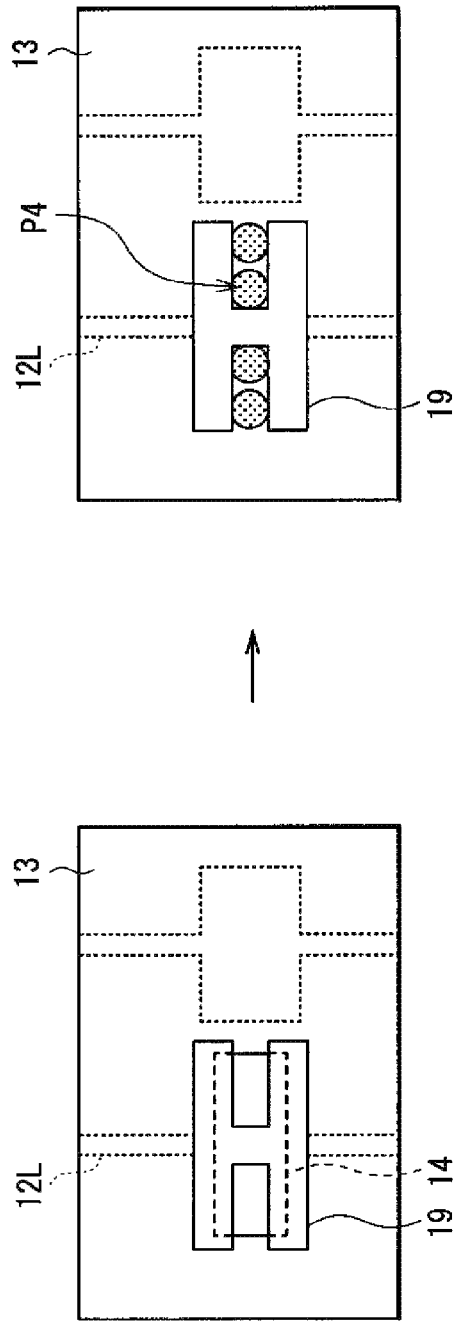
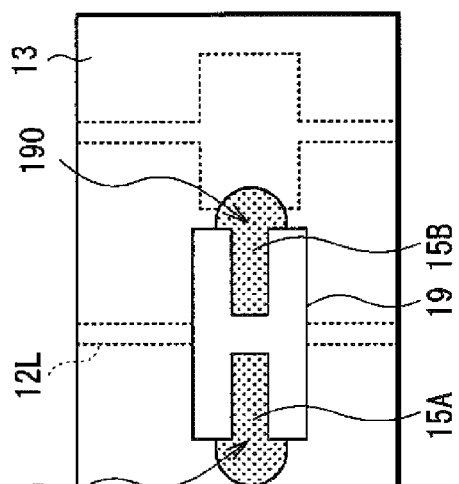
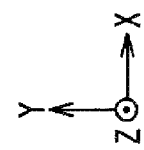

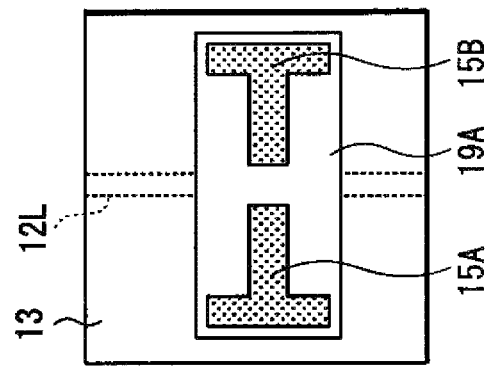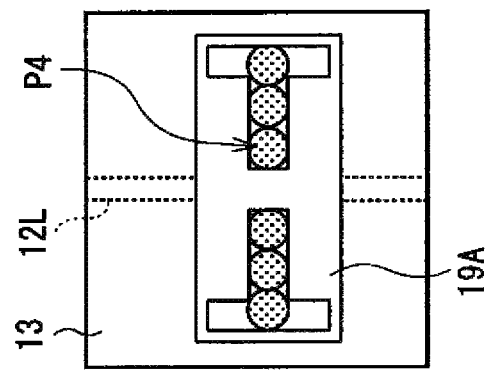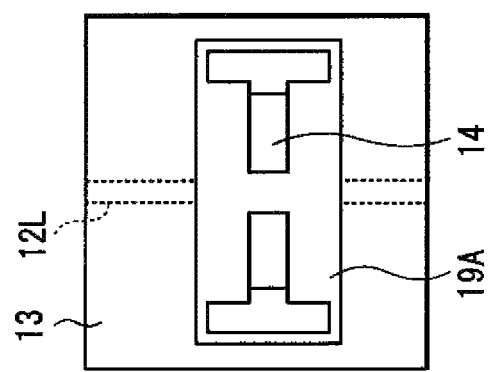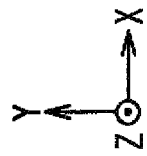

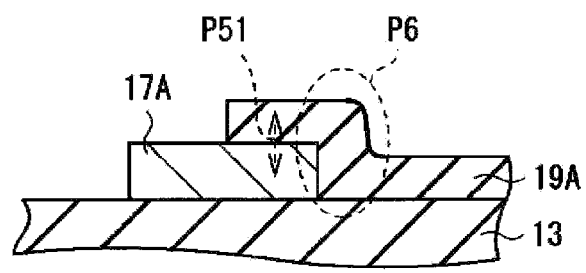
FIG. 19A
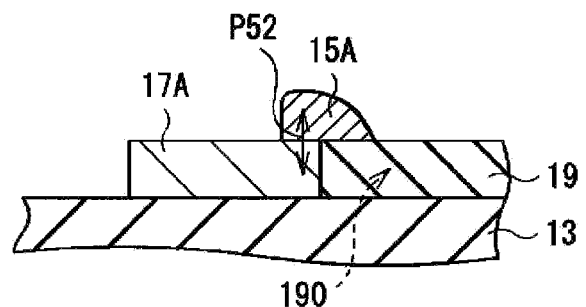
FIG. 19B
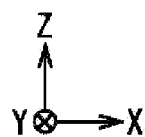
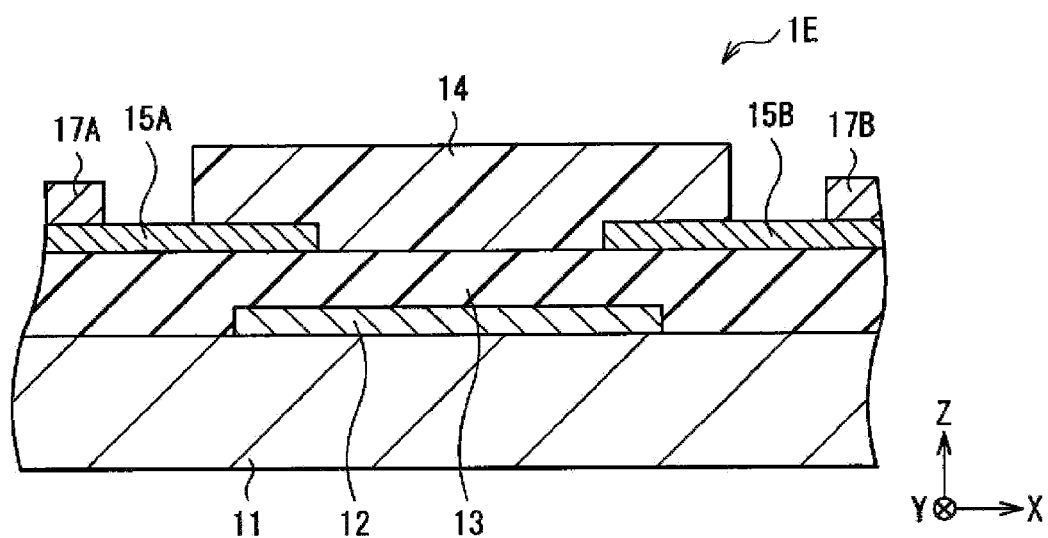
FIG. 20

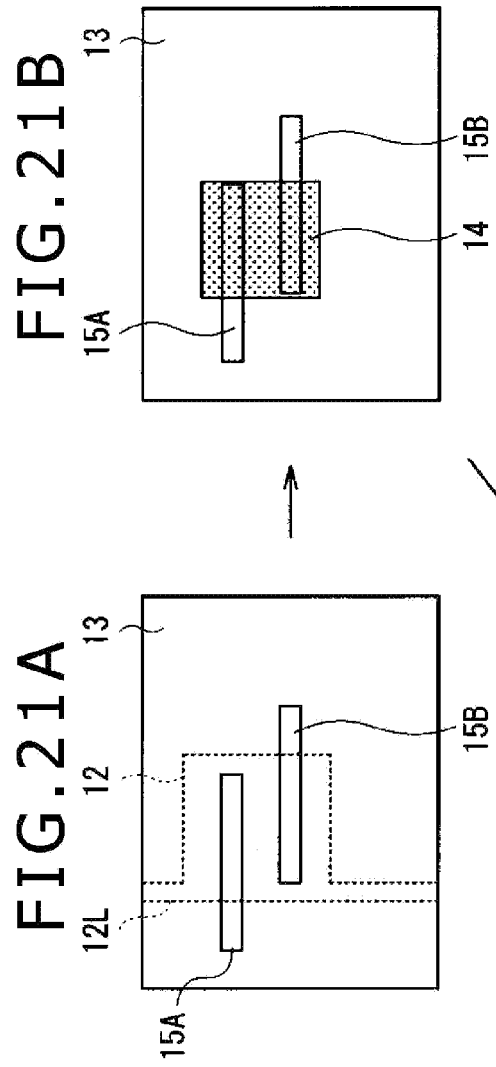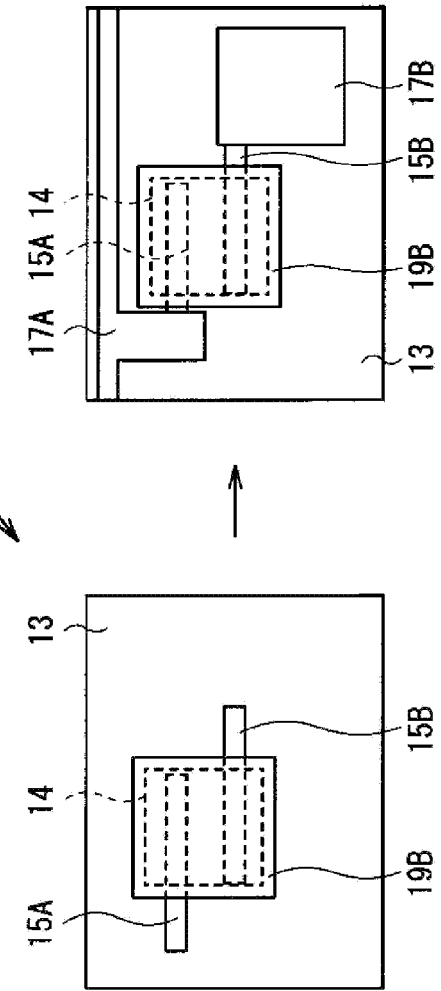

FIG.22A
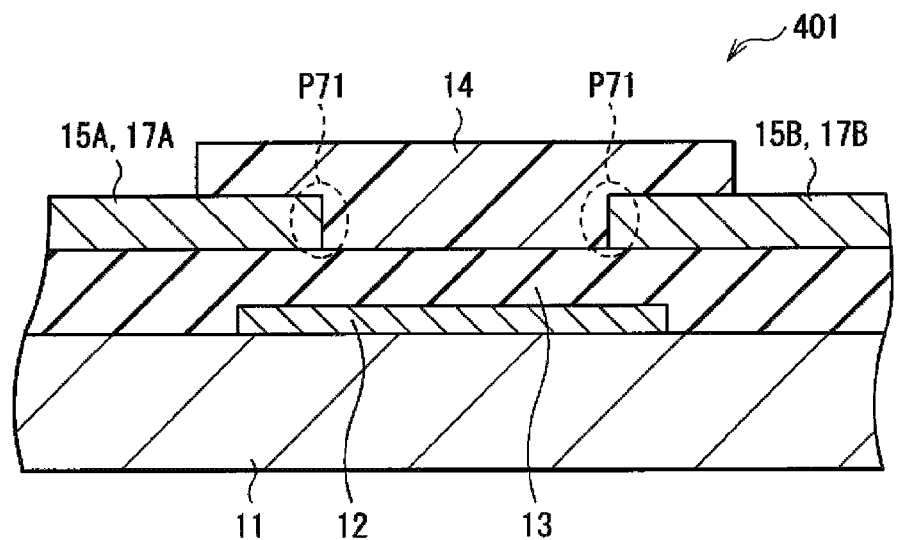
FIG.22B
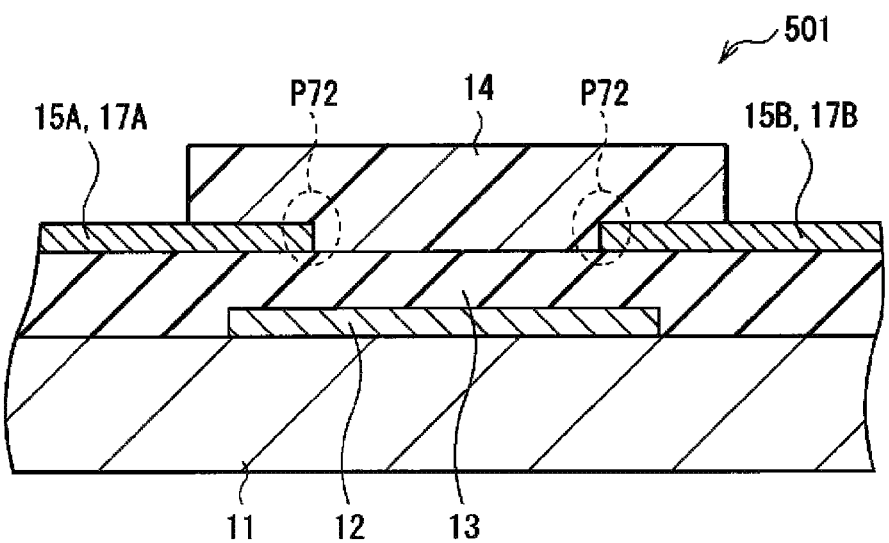
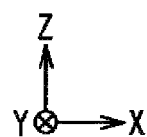

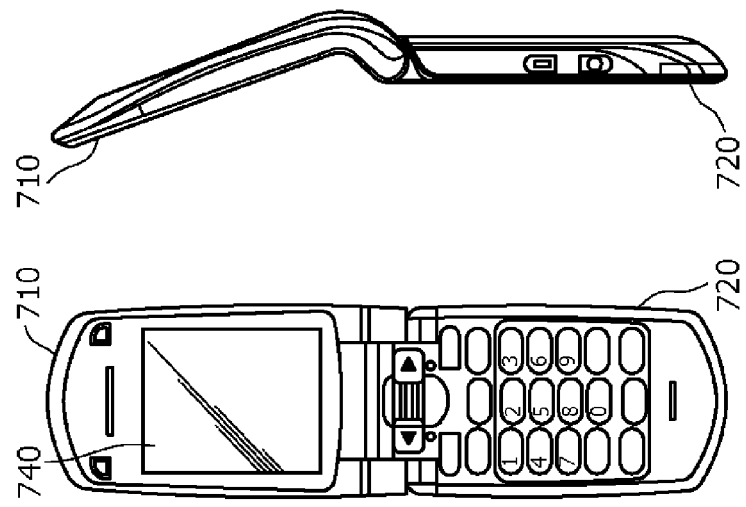
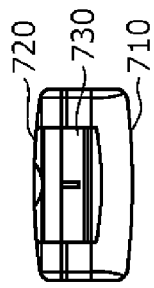
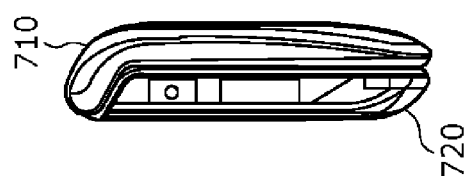
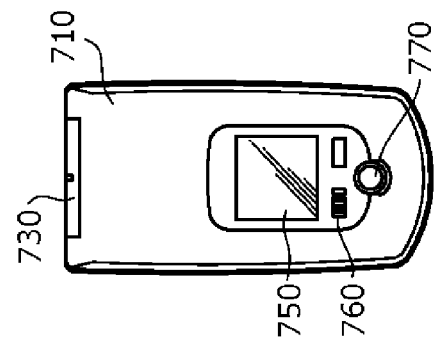
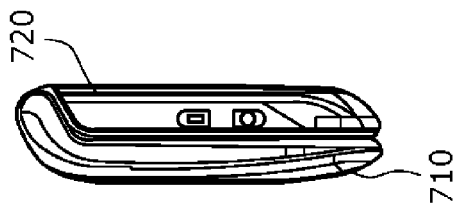
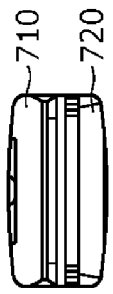

SEMICONDUCTOR ELEMENT, METHOD FOR MANUFACTURING SAME, DISPLAY DEVICE, AND ELECTRONIC DEVICE

CROSS REFERENCES TO RELATED APPLICATIONS

The present application claims priority to Japanese Priority Patent Application JP 2011-136492 filed in the Japan Patent Office on Jun. 20, 2011, JP 2011-279240 filed in the Japan Patent Office on Dec. 21, 2011, the entire content of which is hereby incorporated by reference.

BACKGROUND

The present disclosure relates to a semiconductor element having an organic semiconductor layer, a method for manufacturing the same, and a display device and an electronic device including such a semiconductor element.

Development of semiconductor elements using organic semiconductors such as organic TFTs (Thin Film Transistors) and the like has recently been underway (see C. D. Dimitrakopoulos and P. R. L. Malenfant, Adv. Mater. 2002, 14, No. 2, p. 99, for example). The semiconductor elements using the organic semiconductors are assumed to be applied to display devices such as flexible organic EL (Electro Luminescence) displays, flexible electronic papers, and the like as well as electronic devices such as flexible printed boards, organic thin film solar batteries, touch panels, and the like.

SUMMARY

When an electrode (for example a source electrode and a drain electrode) and a wiring layer are formed on an organic semiconductor layer in a semiconductor element using the organic semiconductor as described above, a break in the wiring layer may occur in the vicinity of end parts of the organic semiconductor layer (edge parts of a semiconductor island), for example. In addition, when the organic semiconductor layer is formed on the electrode, contact resistance between the organic semiconductor layer and the electrode or wiring resistance may be increased. Such a break in the wiring layer and such an increase in resistance value are factors in manufacturing defects. Therefore the proposition of a method for improving reliability is desired.

The present disclosure has been made in view of such problems. It is desirable to provide a semiconductor element, a method for manufacturing the same, as well as a display device and an electronic device that can improve reliability.

A semiconductor element according to an embodiment of the present disclosure includes: an organic semiconductor layer; an electrode disposed so as to be in contact with the organic semiconductor layer; and a wiring layer formed separately from the electrode and electrically connected to the electrode.

A display device according to an embodiment of the present disclosure includes the semiconductor element according to the above-described embodiment of the present disclosure and a display layer.

An electronic device according to an embodiment of the present disclosure includes the display device according to the above-described embodiment of the present disclosure.

In the semiconductor element, the display device, and the electronic device according to the above-described embodiments of the present disclosure, the electrode disposed so as to be in contact with the organic semiconductor layer and the wiring layer electrically connected to the electrode are formed separately from each other. This can prevent a break in the wiring layer in the vicinity of end parts of the organic semiconductor layer (edge parts of a semiconductor island), for example, from occurring easily, and reduce wiring resistance while suppressing contact resistance between the organic semiconductor layer and the electrode, as compared with a case where the electrode and the wiring layer are formed integrally with each other.

A method for manufacturing a semiconductor element according to an embodiment of the present disclosure includes: forming an organic semiconductor layer and an electrode in contact with the organic semiconductor layer; and forming a wiring layer electrically connected to the electrode.

In the method for manufacturing the semiconductor element according to the above-described embodiment of the present disclosure, the electrode in contact with the organic semiconductor layer is formed, and the wiring layer electrically connected to the electrode is formed. This can prevent a break in the wiring layer in the vicinity of end parts of the organic semiconductor layer (edge parts of a semiconductor island), for example, from occurring easily and reduce wiring resistance while suppressing contact resistance between the organic semiconductor layer and the electrode as compared with a case where the electrode and the wiring layer are formed integrally with each other (in a same process).

According to the semiconductor element, the display device, and the electronic device according to the above-described embodiments of the present disclosure, the electrode disposed on the organic semiconductor layer so as to be in contact with the organic semiconductor layer and the wiring layer electrically connected to the electrode are formed separately from each other. It is therefore possible to prevent a break in the wiring layer in the vicinity of end parts of the organic semiconductor layer, for example, from occurring easily, and reduce wiring resistance while suppressing contact resistance. Thus, reliability can be improved.

According to the method for manufacturing the semiconductor element according to the above-described embodiment of the present disclosure, the electrode is formed on the organic semiconductor layer so as to be in contact with the organic semiconductor layer, and thereafter the wiring layer electrically connected to the electrode is formed. It is therefore possible to prevent a break in the wiring layer in the vicinity of end parts of the organic semiconductor layer, for example, from occurring easily, and reduce wiring resistance while suppressing contact resistance. Thus, reliability can be improved.

Additional features and advantages are described herein, and will be apparent from the following Detailed Description and the figures.

BRIEF DESCRIPTION OF THE FIGURES

FIGS. 2A, 2B, 2C, and 2D are schematic diagrams of assistance in explaining alignment displacement accommodating regions in source-drain electrodes;

FIGS. 3A, 3B, and 3C are schematic diagrams of assistance in explaining the arrangement and shapes of an organic semiconductor layer, source-drain electrodes, and a protective film;

FIGS. 4A and 4B are schematic diagrams of assistance in explaining details of projection parts and recessed parts shown in FIGS. 3A and 3B;

FIGS. 6A, 6B, 6C, 6D, and 6E are plan views showing a method for manufacturing the thin film transistor according to the first embodiment in order of processes;

FIGS. 7A and 7B are schematic diagrams of assistance in explaining problems in thin film transistors according to a second and a third comparative example;

FIGS. 10A, 10B, 10C, 10D, 10E, and 10F are plan views showing an example of the constitution of a thin film transistor according to a second embodiment and a method for manufacturing the thin film transistor according to the second embodiment in order of processes;

FIGS. 11A, 11B, 11C, 11D, and 11E are plan views showing an example of the constitution of a thin film transistor according to a third embodiment and a method for manufacturing the thin film transistor according to the third embodiment in order of processes;

FIGS. 12A, 12B, 12C, 12D, and 12E are plan views showing an example of the constitution of a thin film transistor according to a fourth embodiment and a method for manufacturing the thin film transistor according to the fourth embodiment in order of processes;

FIGS. 14A to 14J are plan views showing a method of manufacturing the thin film transistor according to the fifth embodiment in order of processes;

FIGS. 15A and 15B are plan views of assistance in explaining relation between the position of formation of a bank and the shape of source-drain electrodes;

FIGS. 16A to 16F are plan views showing a method of manufacturing a thin film transistor according to a first example of modification in order of processes;

FIGS. 17A to 17E are plan views showing a method of manufacturing a thin film transistor according to a second example of modification in order of processes;

FIGS. 18A, 18B, and 18C are plan views of assistance in explaining a constitution of a bank according to a third example of modification and a method of forming source-drain electrodes using the bank;

FIGS. 19A and 19B are sectional views of assistance in explaining relation between the shapes of banks and contacts between source-drain electrodes and wiring layers;

FIG. 20 is a sectional view showing an example of constitution of a thin film transistor according to a sixth embodiment;

FIGS. 21A, 21B, 21C, and 21D are plan views showing a method of manufacturing the thin film transistor according to the sixth embodiment in order of processes;

FIGS. 22A and 22B are sectional views of constitutions of thin film transistors according to a fourth and a fifth example of comparison;

FIG. 29A is a front view of a sixth example of application in an opened state, FIG. 29B is a side view of the sixth example of application in the opened state, FIG. 29C is a front view of the sixth example of application in a closed state, FIG. 29D is a left side view of the sixth example of application in the closed state, FIG. 29E is a right side view of the sixth example of application in the closed state, FIG. 29F is a top view of the sixth example of application in the closed state, and FIG. 29G is a bottom view of the sixth example of application in the closed state.

DETAILED DESCRIPTION

Preferred embodiments of the present disclosure will hereinafter be described in detail with reference to the drawings. Incidentally, description will be made in the following order.
1. First Embodiment (Example of Printing Formation of Source-Drain Electrodes and Vacuum Film Formation of Wiring Layers)
2. Second Embodiment (Example of Printing Formation of Source-Drain Electrodes and Wiring Layers)
3. Third Embodiment (Example of Vacuum Film Formation of Source-Drain Electrodes and Printing Formation of Wiring Layers)
4. Fourth Embodiment (Example of Vacuum Film Formation of Source-Drain Electrodes and Wiring Layers)
5. Fifth Embodiment (Example of Forming Source-Drain Electrodes by Using Bank)
6. Examples of Modification of Fifth Embodiment (First to Third Examples of Modification)
7. Sixth Embodiment (Example of Bottom-Contact Type)
8. Examples of Application (Examples of Application to Display Devices and Electronic Devices)
9. Other Examples of Modification First Embodiment

[General Constitution of Thin Film Transistor 1]

Figure 1A:
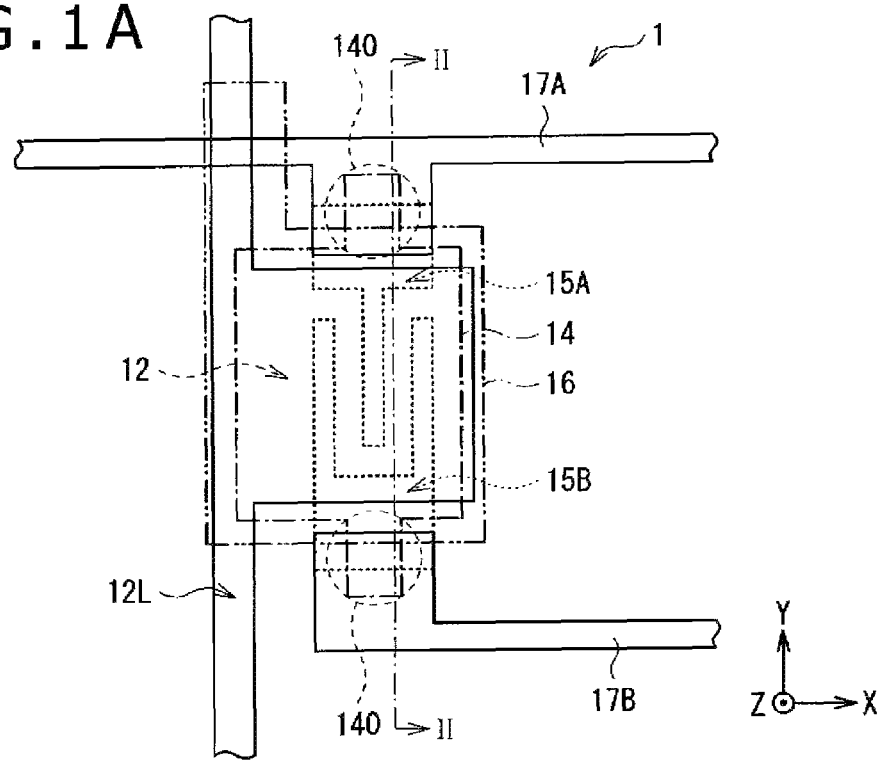
FIGS. 1A and 1B are diagrams showing an example of the constitution of a thin film transistor as a semiconductor element according to a first embodiment of the present disclosure.
Figure 1B:
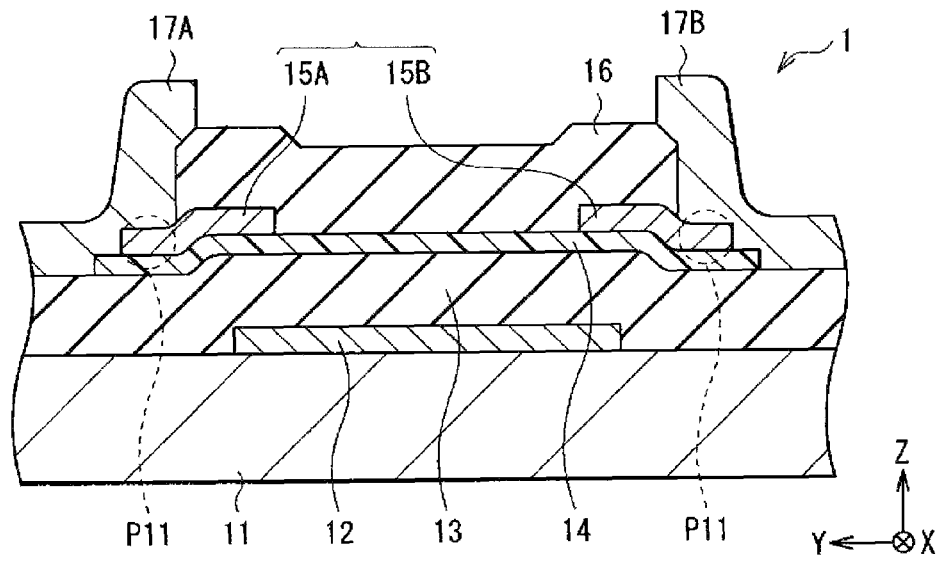

FIGS. 1A and 1B schematically show a general constitution of a semiconductor element (thin film transistor 1) according to a first embodiment of the present disclosure. FIG. 1A shows a planar constitution (X-Y planar constitution). FIG. 1B shows a sectional constitution (Y-Z sectional constitution) taken along a line II-II in the direction of arrows in FIG. 1A. This thin film transistor 1 is of a top-contact staggered type used in an active matrix circuit of a display device, for example. The thin film transistor 1 for example has a structure formed by laminating a gate electrode 12, a gate insulating film 13, an organic semiconductor layer 14, a pair of source-drain electrodes 15A and 15B (electrodes), a protective film 16, and a pair of wiring layers 17A and 17B in this order on a substrate 11. That is, the thin film transistor 1 is an organic TFT using an organic semiconductor.

The substrate 11 is for example formed of an inorganic material such as glass, quartz, silicon, gallium arsenide, or the like, a metallic material, a plastic material, or the like. The metallic material includes for example aluminum (Al), nickel (Ni), or stainless steel. The plastic material includes polyimide, polyethylene terephthalate (PET), polyethylene naphthalate (PEN), polymethyl methacrylate (PMMA), polycarbonate (PC), polyethersulfone (PES), polyetheretherketone (PEEK), aromatic polyester (liquid crystal polymer), and the like. The substrate 11 may be a rigid substrate such as a wafer or the like, or may be a flexible substrate such as a thin layer glass, film, paper (ordinary paper), or the like. Incidentally, the surface of the substrate 11 may be for example provided with various kinds of layers such as a buffer layer for ensuring adhesion, a gas barrier layer for preventing the release of a gas, and the like.

The gate electrode 12 functions as a gate electrode of the thin film transistor 1. The gate electrode 12 in this case is electrically connected to gate wiring 12L extending along a Y-axis direction. The gate electrode 12 is disposed on the substrate 11. The gate electrode 12 is for example formed of one kind or two or more kinds of metallic material, inorganic conductive material, organic conductive material, or carbon material. The metallic material is for example aluminum, copper (Cu), molybdenum (Mo), titanium (Ti), chromium (Cr), nickel, palladium (Pd), gold (Au), silver (Ag), platinum (Pt), or alloys including these elements. The inorganic conductive material is for example indium oxide (In2O3), indium tin oxide (ITO), indium zinc oxide (IZO), or zinc oxide (ZnO). The organic conductive material is for example polyethylenedioxythiophene (PEDOT) or polystyrene sulfonate (PSS). The carbon material is for example graphite. Incidentally, the gate electrode 12 may also be formed by laminating two or more layers of various kinds of materials described above.

The gate insulating film 13 covers the gate electrode 12 and the gate wiring 12L, and is for example formed of one kind or two kinds or more of inorganic insulative material or organic insulative material. The inorganic insulative material is for example silicon oxide ($SiO_x$), silicon nitride ($SiN_x$), aluminum oxide ($Al_2O_3$), titanium oxide ($TiO_2$), hafnium oxide ($HfO_x$), or barium titanate ($BaTiO_3$). The organic insulative material is for example polyvinylphenol (PVP), polyimide, polymethacrylic acid acrylate, photosensitive polyimide, photosensitive novolac resin, or polyparaxylylene. Incidentally, the gate insulating film 13 may also be formed by laminating two or more layers of various kinds of materials described above.

The organic semiconductor layer 14 is formed in the shape of an island in a region of formation of the thin film transistor 1. The organic semiconductor layer 14 is for example formed by a PXX (peri-xanthenoxanthene) derivative. The organic semiconductor layer 14 may also be for example formed of another organic semiconductor material such as pentacene ($C_{22}H_{14}$), polythiophene, or the like.

The source-drain electrodes 15A and 15B are electrodes disposed on the organic semiconductor layer 14 so as to be in contact with the organic semiconductor layer 14. The source-drain electrodes 15A and 15B in this case have a planar shape (X-Y planar shape) of a comb. However, the shape of the source-drain electrodes 15A and 15B is not limited to this. The source-drain electrodes 15A and 15B are desirably formed of a conductive material, especially a metal that can provide an ohmic contact with the organic semiconductor layer 14 as it is, a metallic oxide, a conductive polymer, carbon, or the like. Such a metal includes for example gold (Au), copper (Cu), silver (Ag), nickel (Ni), or titanium (Ti). The source-drain electrodes 15A and 15B may also have for example a laminated structure formed by laminating a titanium (Ti) layer having a thickness of 20 nm, an aluminum (Al) layer having a thickness of 200 nm, and a titanium (Ti) layer having a thickness of 20 nm in this order. The above-described metallic oxide includes for example $CuO_x$, $NiO_x$, $TiO_x$, ITO (Indium Tin Oxide), $MoO_x$, and $WO_N$. In addition, the above-described conductive polymer includes for example water-soluble PEDOT-PSS.

The protective film 16 is disposed so as to cover at least a part of the source-drain electrodes 15A and 15B and the wiring layers 17A and 17B. The protective film 16 is for example formed of a fluorocarbon resin such as $(C_6F_{10})_n$ or the like. This protective film 16 is desirably a resin dissolved in a solvent that does not damage the organic semiconductor layer 14. Incidentally, such a resin includes not only the above-described fluorocarbon resin but also PVA (polyvinyl alcohol; water-soluble), a parylene resin, and the like.

The wiring layers 17A and 17B are each formed separately from (in a process separate from that of) the source-drain electrodes 15A and 15B, and are electrically connected to the source-drain electrodes 15A and 15B. Specifically, the wiring layer 17A is electrically connected to the source-drain electrode 15A, and the wiring layer 17B is electrically connected to the source-drain electrode 15B. The wiring layers 17A and 17B are for example formed of a material similar to that of the source-drain electrodes 15A and 15B as described above. The wiring layers 17A and 17B in this case extend in an X-axis direction.

[Detailed Constitution of Organic Semiconductor Layer 14, Source-Drain Electrodes 15A and 15B, Protective Film 16, Etc.]

In the present embodiment, as shown in FIGS. 2A to 2C, for example, each of electrode ends (electrode ends in the Y-direction in this case) of the source-drain electrodes 15A and 15B is provided with an alignment displacement accommodating region 150. The alignment displacement accommodating regions 150 are regions (regions in a rectangular shape in this case) for taking into consideration positioning margins (alignment displacement margins) $\Delta x$ and $\Delta y$ along the X-axis direction and the Y-axis direction, respectively, and are disposed so as to include the source-drain electrodes 15A and 15B individually. Specifically, instead of both of the pair of source-drain electrodes 15A and 15B being disposed within one alignment displacement accommodating region 150 as in a first comparative example shown in FIG. 2D, for example, only one of the pair of source-drain electrodes 15A and 15B is disposed within one alignment displacement accommodating region 150. In this manner, as will be described later in detail, positioning displacement (alignment displacement) at a time of printing formation of the source-drain electrodes 15A and 15B is accommodated, so that manufacturing defects can be prevented.

In addition, as shown in FIG. 1A, FIG. 3A, and FIG. 4A, the organic semiconductor layer 14 has projection parts 140 as regions overlapping the source-drain electrodes 15A and 15B outside a region of formation of the protective film 16. Specifically, the projection parts 140 are formed so as to protrude from the region of formation of the protective film 16 along the Y-axis direction, and are arranged so as to overlap the above-described alignment displacement accommodating regions 150 of the source-drain electrodes 15A and 15B (see a reference P11 in FIG. 1B and FIG. 4A). Thus, as will be described later in detail, a break (step disconnection) in the wiring layers 17A and 17B in the vicinity of end parts of the organic semiconductor layer 14 (edge parts of the semiconductor island) does not occur easily (desirably the occurrence of such a break is avoided).

Alternatively, as shown in FIGS. 3B and 4B, the protective film 16 may have recessed parts 160 as notch regions. Specifically, the notch regions (recessed parts 160) are formed along the Y-axis direction, and the organic semiconductor layer 14 overlaps the source-drain electrodes 15A and 15B in the notch regions (see a reference P12 in FIG. 4B and FIG. 5 (sectional view taken along a line III-III in the direction of arrows in FIG. 3B)). However, the above-described alignment displacement accommodating regions 150 of the source-drain electrodes 15A and 15B are arranged so as not to overlap the recessed parts 160. Also when such recessed parts 160 are provided, as will be described later in detail, a break (step disconnection) in the wiring layers 17A and 17B in the vicinity of the end parts of the organic semiconductor layer 14 (edge parts of the semiconductor island) does not occur easily (desirably the occurrence of such a break is avoided).

[Method of Manufacturing Thin Film Transistor 1]

The thin film transistor 1 can be manufactured as follows, for example. FIGS. 6A to 6E are plan views (X-Y plan views) showing an example of main processes in the method of manufacturing the thin film transistor 1 according to the present embodiment in order of the processes.

First, as shown in FIG. 6A, a gate electrode 12 and gate wiring 12L are formed on a substrate 11 not shown in the figure, and a gate insulating film 13 not shown in the figures is formed on the gate electrode 12 and the gate wiring 12L.

Specifically, a substrate 11 made of a material described above is prepared, and a gate electrode material film (not shown) made of a metallic material described above is formed on the substrate 11 by a vacuum film forming method, a coating method, or a plating method, for example. The vacuum film forming method is for example a vacuum deposition method, a flash deposition method, a sputtering method, a physical vapor deposition method (PVD), a chemical vapor deposition method (CVD), a pulsed laser deposition method (PLD), or an arc discharge method. The coating method is for example a spin coat method, a slit coat method, a bar coat method, or a spray coat method. The plating method is for example an electroplating method or an electroless plating method.

Next, a mask such as a resist pattern or the like (not shown) is formed on the gate electrode material film. Then, the gate electrode material film is etched using the mask, and thereafter the mask is removed by using an ashing method, an etching method, or the like. In this manner, as shown in FIG. 6A, the gate electrode 12 and the gate wiring 12L are formed on the substrate 11. In a case where the resist pattern is formed, for example, a photoresist film is formed by applying a photoresist, and thereafter the photoresist film is patterned by using a photolithography method, a laser writing method, an electron beam writing method, an X-ray writing method, or the like. However, the resist pattern may be formed by using a resist transfer method or the like. A method of etching the gate electrode material film is for example a dry etching method or a wet etching method using an etchant solution. The dry etching method is for example ion milling or a reactive ion etching (RIE). The same is true for the etching method for removing the mask.

Incidentally, a method of forming the gate electrode 12 and the like may be for example a printing method such as an ink jet method, a screen printing method, a gravure printing method, or a gravure offset printing method. In addition, a metallic pattern may be formed as a mask in place of the resist pattern using a laser ablation method, a mask deposition method, a laser transfer method, or the like. Of course, in order to form the gate electrode 12 and the like, an inorganic conductive material, an organic conductive material, a carbon material described above can also be used in place of a metallic material.

Next, a gate insulating film 13 is formed so as to cover the gate electrode 12 and the gate wiring 12L. A procedure for forming the gate insulating film 13 differs depending on a material forming the gate insulating film 13, for example. The forming procedure in a case of using an inorganic insulative material is for example similar to that of the formation of the gate electrode 12 and the like except that the coating method may be a sol-gel process or the like. The forming procedure in a case of using an organic insulative material is for example similar to that of the formation of the gate electrode 12 and the like except that a photosensitive material may be patterned by using a photolithography method or the like.

Next, as shown in FIG. 6B, an organic semiconductor layer 14 is formed on the gate insulating film 13 not shown in the figure by using a coating method or a deposition method, for example. Description in the following will be made of a case where the organic semiconductor layer 14 has projection parts 140 described above as an example.

Specifically, first, a solution including an organic semiconductor material described above, for example the PXX derivative dispersed or dissolved in a solvent such as an organic solvent or the like (mixed solution), for example, is prepared. The mixed solution is applied to the upper surface of the gate insulating film 13, and then heated (fired). An organic semiconductor material film made of the above-described organic semiconductor material, for example the PXX derivative is thus formed on the gate insulating film 13. Usable as the solvent is for example toluene, xylene, mesitylene, or tetralin.

Next, element isolation is performed on the organic semiconductor material film formed in this manner by using a laser ablation method, whereby the organic semiconductor layer 14 of the island shape described above is formed. However, the method for the element isolation is not limited to the laser ablation method, but a method using a metallic protective film layer or a method of patterning onto a photosensitive fluorocarbon resin may be used. Alternatively, the organic semiconductor layer 14 may be directly formed into a pattern by a printing method, and this element isolation process may be omitted. However, it is desirable to use the laser ablation method to minimize damage caused to the surface of the organic semiconductor layer 14.

Next, as shown in FIG. 6C, source-drain electrodes 15A and 15B of the above-described shape are formed on the organic semiconductor layer 14 so as to be in contact with the organic semiconductor layer 14. Specifically, in the present embodiment, the source-drain electrodes 15A and 15B are formed by using a printing method (printing process). More specifically, the source-drain electrodes 15A and 15B are formed by directly patterning water-soluble PEDOT-PSS on the organic semiconductor layer 14 using a reverse offset printing method, for example, and thereafter performing heat treatment at a temperature of 140° C. for about one hour, for example. However, the electrode material is not limited to PEDOT-PSS, but a Ag nano-ink or a Cu nano-ink, for example, may be used as an ink material to use Ag or Cu as an electrode material. Alternatively, a carbon-base material (carbon material) such as graphene, a carbon nanotube, or the like may be used as an electrode material. In addition, as for the type of the printing method, the printing method is not limited to the reverse offset printing method described above, but another printing method may be used.

Next, as shown in FIG. 6D, a protective film 16 made of a material described above is formed on the organic semiconductor layer 14 and the source-drain electrodes 15A and 15B. Specifically, after a fluorocarbon resin such as $(C_6F_{10})_n$, for example, is applied to the entire surface, an ordinary photoresist is applied onto the film of the fluorocarbon resin, and a desired pattern is formed by using photolithography technology, whereby the protective film 16 is formed. At the time of the pattern formation using photolithography technology, the fluorocarbon resin film is dry-etched using oxygen plasma. This dry etching is performed until the above-described alignment displacement accommodating regions 150 of the source-drain electrodes 15A and 15B are exposed. The photoresist is removed after the etching. Incidentally, the pattern formation by the photolithography technology using a photosensitive fluorocarbon resin can also be performed. Incidentally, while the above description has been made by taking the pattern formation using photolithography technology as an example, the pattern formation is not limited to this. Further, the protective film 16 may be directly formed into a pattern by using a printing method such as a reverse offset printing method, for example.

Next, as shown in FIG. 6E, wiring layers 17A and 17B electrically connected to the source-drain electrodes 15A and 15B are formed. Specifically, in the present embodiment, the wiring layers 17A and 17B are formed by using a vacuum film forming process and photolithography technology (formed by vacuum film formation). Thus, the above-described source-drain electrodes 15A and 15B are formed separately from (in a process separate from that of) the wiring layers 17A and 17B.

Specifically, first, a laminate film formed by laminating a Ti layer having a thickness of 20 nm, an Al layer having a thickness of 200 nm, and a Ti layer having a thickness of 20 nm in this order is formed over the entire surface by using a sputtering method, for example. Thereafter, an ordinary photoresist film is applied, and a desired pattern is formed by using photolithography technology. Next, the above laminate film is wet-etched using a mixed acid of a nitric acid, a hydrofluoric acid, and a phosphoric acid, for example, and thereafter the photoresist film is dissolved and removed, whereby the wiring layers 17A and 17B are formed. As a result of the above, the thin film transistor 1 shown in FIGS. 1A and 1B is completed.

Incidentally, while description has been made by taking Ti/Al/Ti as an example of the material for the wiring layers 17A and 17B, the material for the wiring layers 17A and 17B is not limited to this, but various kinds of materials described above can be used. However, it can be said that Ti/Al/Ti is preferably used because the material is inexpensive, has a low wiring resistance, provides an excellent adhesion property between the substrate and wiring, and facilitates wet etching. In addition, while description has been made by taking a sputtering method as an example of a film forming method, the film forming method is not limited to this, but various film forming methods such for example as resistance heating evaporation, electron beam heating evaporation, and a CVD method are applicable. Further, while an example in which photolithography technology is used as a patterning method is cited in the above description, the patterning method is not limited to this, but patterning may be performed by using a laser ablation method, for example. In addition, while the above description has been made by taking wet etching processing as an example, the etching is not limited to this, but the wiring layers 17A and 17B may be processed by reactive ion etching using chlorine or a mixed gas of chlorine and carbon tetrafluoride.

In this case, in the finally formed thin film transistor 1, the outer edge parts of the organic semiconductor layer 14 (edge parts of the semiconductor island) are completely covered by the protective film 16 or the wiring layers 17A and 17B. Thus, in the present embodiment, a resin dissolved in an organic solvent can be applied and formed in a process subsequent to that of FIG. 6E. If a part of the outer edge parts of the organic semiconductor layer 14 (edge parts of the semiconductor island) are exposed in this stage, a process of covering the surfaces of the edges (for example a process of applying a fluorocarbon resin and patterning the fluorocarbon resin) needs to be provided, which leads to an increase in the number of processes and an increase in manufacturing cost. It can therefore be said that the formation as shown in FIG. 6E is preferable to avoid such a situation.

[Action and Effect of Thin Film Transistor 1]

In the thin film transistor 1, when a voltage (gate voltage) equal to or higher than a predetermined threshold voltage is applied to the gate electrode 12 via the gate wiring 12L, a channel is formed within the organic semiconductor layer 14. Thus, a current (drain current) flows between the source-drain electrodes 15A and 15B, and the thin film transistor 1 functions as a transistor (organic TFT).

(1. Problems of Existing Methods)

A method is used in the past which forms source-drain electrodes by directly forming and etching a metallic layer on an organic semiconductor layer in such an organic TFT. However, this method may cause damage to the surface of the organic semiconductor, and degrade characteristics, depending on a combination between the organic semiconductor and the electrode metal.

On the other hand, when the source-drain electrodes of a top contact type are directly formed into a pattern by using a printing process (printing method), ideally, the source-drain electrodes can be formed without anything touching the surface of the organic semiconductor layer on the channel. It is thus possible to form a top contact structure while suppressing damage to the organic semiconductor layer, and obtain an excellent transistor characteristic. That is, the printing method can be said to be a suitable method as a method of forming source-drain electrodes when an organic TFT of a bottom-gate staggered type is manufactured. In addition, among electrode forming techniques based on such a printing method, a wiring forming technique based on a reverse offset printing method has produced excellent results in terms of definition.

Consideration will be given to a case in which an integrated circuit is manufactured using an organic TFT of a bottom-gate staggered type. Consideration will be given particularly to a case in which each of source-drain electrodes and wiring layers is formed by using a reverse offset printing method. In this case, the following problems occur when the source-drain electrodes and the wiring layers are formed en bloc (formed in a same process) using a printing method (reverse offset printing method), and especially when an organic TFT of a bottom-gate staggered type is integrated.

As a first problem, a break (step disconnection) in the wiring layers may occur in the vicinity of end parts of the organic semiconductor layer (edge parts of the semiconductor island), for example, when the electrodes (a source electrode and a drain electrode) and the wiring layers are formed on the organic semiconductor layer. This is due to a fact that the surface of the organic semiconductor layer in the shape of an island, which surface is an object to be printed, is not a flat surface, and thus the wiring tends to be broken in the vicinity of the edges, though the surface of the organic semiconductor layer has a small level difference of a few ten nm. Such a break (step disconnection) in the wiring layers in the vicinity of end parts of the organic semiconductor layer or the like does not occur when an organic TFT of a bottom contact type is manufactured, but is a problem specific to organic TFTs of a top contact type. Such a break in the wiring layers is a factor in manufacturing defects, and the manufacturing defects are desired to be reduced.

In addition, insufficient pattern positioning accuracy is cited as a second problem. This is for the following reasons. First, due to the mechanical precision of printing equipment and the distortion of the blanket, a printed pattern may be displaced from an original position at which the printed pattern should be present. An integrated circuit pattern is therefore a redundant pattern in which the printing position accuracy is taken into consideration. Then, transistor integration density is reduced as compared with an integrated circuit pattern assuming a pattern forming method based on photolithography technology using a stepper and the like (high position accuracy: a positional displacement of less than about ±1 µm).

Further, a few problems in terms of material are cited as a third problem. First, a typical material for printed wiring at present is Ag nanoparticles whose periphery is modified by organic molecules. However, Ag wiring is known to cause electromigration as a result of being energized in high-humidity conditions. Thus, to ensure the reliability of an electric circuit having Ag wiring needs a strong barrier layer (for example glass) for blocking the entry of water from the outside. This represents an obstacle to the fabrication of a flexible circuit using organic TFTs.

Incidentally, a Cu nano-ink capable of eliminating the disadvantages of such Ag wiring has recently been developed. However, the Cu ink still has disadvantages from a viewpoint of practical use because the ink is kept for a short period due to the readily oxidizable property of Cu, and a need to fire the ink in a reducing atmosphere requires special heating equipment, for example.

Other than inks of metallic nanoparticles, a conductive polymer such as PEDOT-PSS or the like or a carbon-base material (carbon material) such as graphene, a carbon nanotube, or the like can be a wiring material. Either of the materials has an ionization potential (or a work function) of about 5 eV, and forms a relatively small electric barrier with respect to an organic semiconductor. In addition, a carbon-base material is inexpensive as compared with inks of metallic nanoparticles, depending on specifications of the carbon-base material. However, both have a high sheet resistance, and can therefore be said to be difficult to use for long wiring.

Because of the three problems described above, forming the source-drain electrodes and the wiring layers en bloc (forming the source-drain electrodes and the wiring layers in a same process) by using a printing method (for example a reverse offset printing method) in organic TFTs of the bottom-gate staggered type especially when fabricating an integrated circuit of organic TFTs of the bottom-gate staggered type involves difficulties from both of a viewpoint of processing and a viewpoint of materials.

(2. Action of Present Embodiment)

Accordingly, the present embodiment solves the three problems described above as follows. Specifically, first, in the thin film transistor 1 according to the present embodiment, the source-drain electrodes 15A and 15B disposed on the organic semiconductor layer 14 so as to be in contact with the organic semiconductor layer 14 are formed separately from the wiring layers 17A and 17B electrically connected to the source-drain electrodes 15A and 15B. In other words, when the thin film transistor 1 is manufactured, the source-drain electrodes 15A and 15B are formed on the organic semiconductor layer 14 so as to be in contact with the organic semiconductor layer 14, and thereafter the wiring layers 17A and 17B electrically connected to the source-drain electrodes 15A and 15B are formed. This prevents a break in the wiring layers 17A and 17B in the vicinity of the end parts of the organic semiconductor layer 14 (edge parts of the semiconductor island), for example, from occurring easily as compared with a case where the source-drain electrodes 15A and 15B are formed integrally with the wiring layers 17A and 17B (formed in a same process as the wiring layers 17A and 17B).

Figure 5:
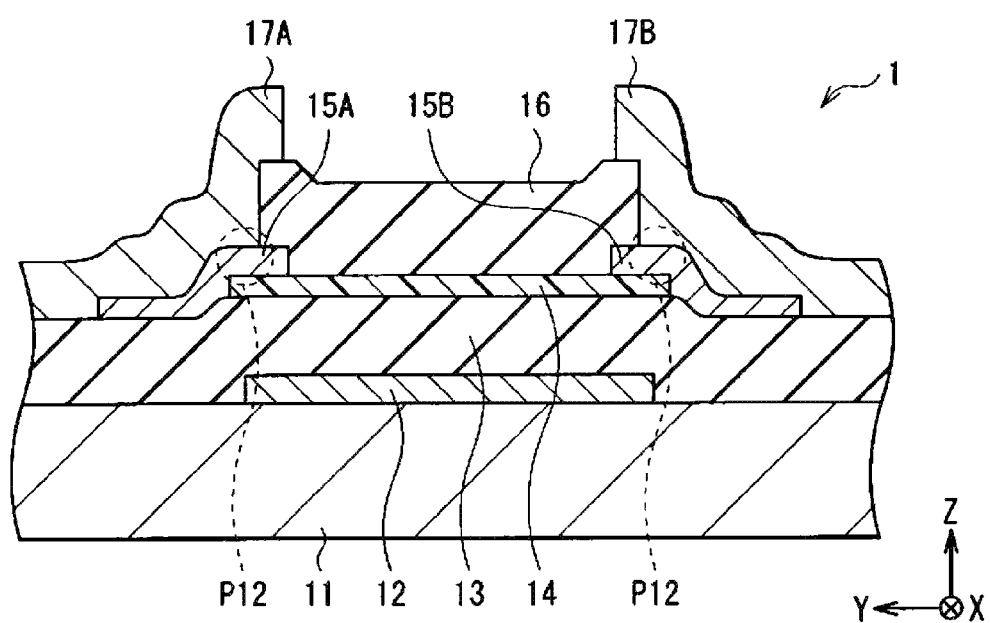
FIG. 5 is a sectional view of another example of the constitution of the thin film transistor according to the first embodiment.

In addition, in the present embodiment, the projection parts 140 shown in FIG. 3A and the like or the recessed parts 160 shown in FIG. 3B and the like, for example, are provided to the organic semiconductor layer 14 or the protective film 16. Thus, the source-drain electrodes 15A and 15B and the wiring layers 17A and 17B are electrically connected to each other (in contact with each other) surely in the regions indicated by hatching in FIG. 4A or 4B (see the references P11 or P12), for example. As a result, as shown in FIG. 1B and FIG. 5, the occurrence of a break (step disconnection) in the wiring layers 17A and 17B is avoided, and more reliable electric connection is ensured.

That is, in a thin film transistor (thin film transistor 201) according to a second comparative example shown in FIG. 3C and FIG. 7A, for example, an organic semiconductor layer 14 does not have projection parts 140, and a protective film 16 does not have recessed parts 160, either. Thus, as indicated by a reference P201 in FIG. 7A, for example, there is a region having only a gate insulating film 13 between layers of a gate electrode 12 and source-drain electrodes 15A and 15B (or wiring layers 17A and 17B). Such a region is highly likely to be a leakage part between the gate electrode 12 and the source-drain electrodes 15A and 15B, and when an integrated circuit on a large scale is fabricated, the integrated circuit may cease to exhibit performance as a circuit.

Figure 8A:
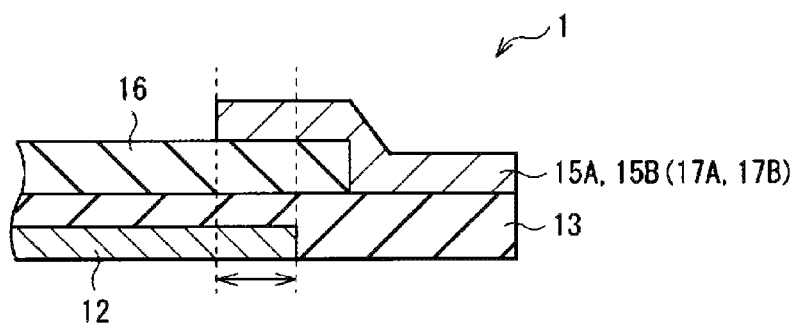
FIGS. 8A, 8B, and 8C are schematic diagrams of assistance in explaining arrangement relation between a gate electrode, a gate insulating film, the organic semiconductor layer, the source-drain electrodes, and the protective film.
Figure 8B:
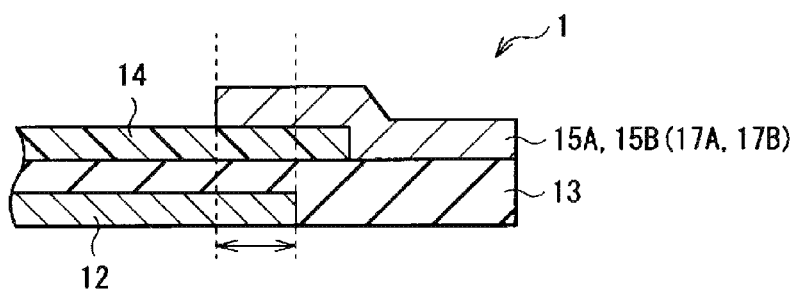
Figure 8C:
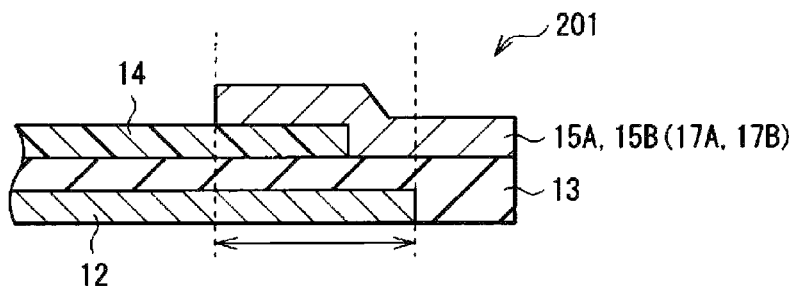

Thus, as shown in FIGS. 8A and 8B, for example, it can be said that the thin film transistor 1 according to the present embodiment preferably has at least one of the organic semiconductor layer 14 and the protective film 16 disposed in a region where the gate electrode 12 overlaps the source-drain electrodes 15A and 15B (wiring layers 17A and 17B). In other words, it is undesirable not to have either of the organic semiconductor layer 14 and the protective film 16 in the region where the gate electrode 12 overlaps the source-drain electrodes 15A and 15B (wiring layers 17A and 17B), as in the thin film transistor 201 according to the second comparative example shown in FIG. 8C, for example.

In addition, in a thin film transistor according to a third comparative example (thin film transistor 301) shown in FIG. 7B, for example, an external shape line of an organic semiconductor layer 14 is located on the outside of an external shape line of a gate electrode 12 in a region connecting wiring layers 17A and 17B to each other. Thus, as indicated by a reference P301 in FIG. 7B, for example, a semiconductor region not modulated by a gate voltage applied to the gate electrode 12 is present between source-drain electrodes 15A and 15B (between the wiring layers 17A and 17B). Such a semiconductor region is highly likely to be a leakage part between the gate electrode 12 and the source-drain electrodes 15A and 15B, and can therefore be said to be an undesirable region for the above-described reasons.

Figure 9:
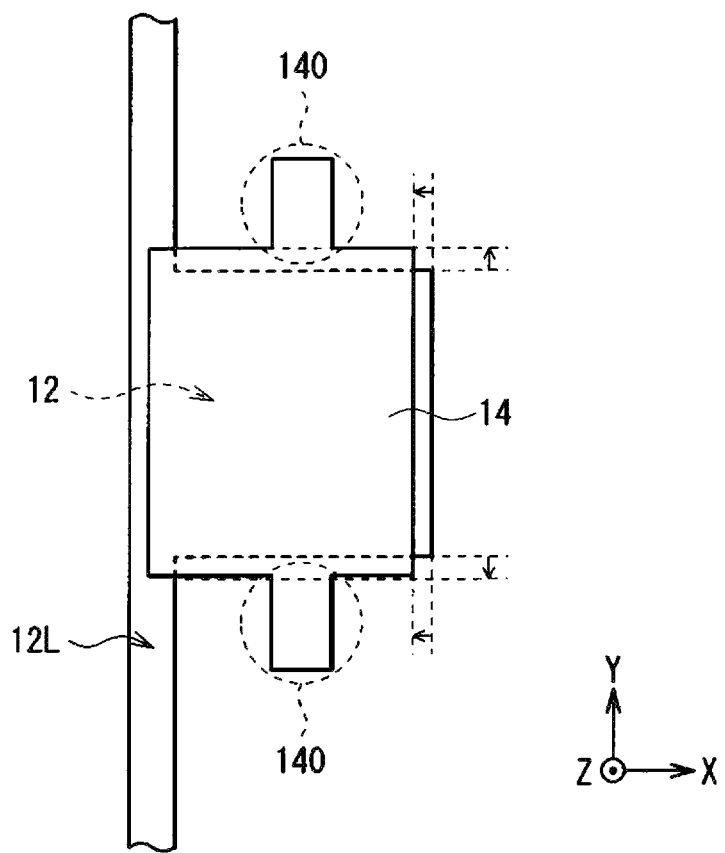
FIG. 9 is a schematic diagram of assistance in explaining arrangement relation between the gate electrode and the organic semiconductor layer.

Thus, it can be said to be preferable that in the thin film transistor 1 according to the present embodiment, as shown in FIG. 9, for example, an external shape line of the organic semiconductor layer 14 be located on the inside of an external shape line of the gate electrode 12 in a region connecting the wiring layers 17A and 17B to each other. In addition to this, for the following reasons, it can be said that conversely the external shape line of the organic semiconductor layer 14 is preferably located on the outside of the external shape line of the gate electrode 12 in a direction of connecting the wiring layers 17A and 17B to each other (Y-axis direction). The following can be said in consideration of conditions of lamination in a Z-direction (direction of thickness) in a region in the vicinity of the external shape line of the semiconductor island of the organic semiconductor layer 14 (source-drain electrodes 15A and 15B). First, when the external shape line of the organic semiconductor layer 14 is located on the outside of the external shape line of the gate electrode 12, the laminated structure in the above-described region is formed by laminating the gate electrode 12, the gate insulating film 13, the organic semiconductor layer 14, and the wiring layers 17A and 17B in this order. On the other hand, when the external shape line of the organic semiconductor layer 14 is located on the inside of the external shape line of the gate electrode 12, the laminated structure in the above-described region is formed by laminating the gate electrode 12, the gate insulating film 13, and the wiring layers 17A and 17B in this order. That is, the former (case where the external shape line of the organic semiconductor layer 14 is located on the outside) has a larger number of laminated layers by one, which corresponds to the organic semiconductor layer 14, than the latter (case where the external shape line of the organic semiconductor layer 14 is located on the inside). Because the former thus has a larger number of laminated layers by one than the latter, the former can be said to reduce the probability of occurrence of an interlayer leakage between the gate wiring and the source wiring or between the gate wiring and the drain wiring as compared with the latter.

As described above, in the present embodiment, the source-drain electrodes 15A and 15B disposed on the organic semiconductor layer 14 so as to be in contact with the organic semiconductor layer 14 are formed separately from the wiring layers 17A and 17B electrically connected to the source-drain electrodes 15A and 15B. In other words, when the thin film transistor 1 is manufactured, the source-drain electrodes 15A and 15B are formed on the organic semiconductor layer 14 so as to be in contact with the organic semiconductor layer 14, and thereafter the wiring layers 17A and 17B electrically connected to the source-drain electrodes 15A and 15B are formed. This can prevent a break in the wiring layers 17A and 17B in the vicinity of the end parts of the organic semiconductor layer 14 (edge parts of the semiconductor island), for example, from occurring easily, and thus reduce manufacturing defects, as compared with a case where the source-drain electrodes 15A and 15B are formed integrally with the wiring layers 17A and 17B (formed in a same process as the wiring layers 17A and 17B). Thus, a large-scale integrated circuit including organic TFTs of the bottom-gate staggered type, for example, can be manufactured with high reproducibility.

In addition, because the source-drain electrodes 15A and 15B are directly patterned and formed by using a printing method, an organic TFT of the bottom-gate staggered type which organic TFT exhibits excellent characteristics can be obtained. This is because a top contact can be formed without damage being caused between the source-drain electrodes 15A and 15B (surface of the organic semiconductor layer 14 directly over the channel).

Further, a choice of materials usable as the source-drain electrodes 15A and 15B can be widened. For example, a material that provides excellent electric connection with an organic semiconductor and is inexpensive, such as a conductive polymer, a carbon-base material, or the like can be selected. This is because even if the material has a high sheet resistance, the problem of an increase in wiring resistance does not occur when the wiring layers 17A and 17B are formed by an ordinary metal (metal having a relatively low sheet resistance).

In addition, because the alignment displacement accommodating regions 150 are provided to the respective electrode ends of the source-drain electrodes 15A and 15B, a positioning displacement (alignment displacement) at the time of printing formation of the source-drain electrodes 15A and 15B can be accommodated (tolerated), so that the occurrence of manufacturing defects can be further suppressed.

In addition, because the outer edge parts of the organic semiconductor layer 14 (edge parts of the semiconductor island) in the thin film transistor 1 are completely covered by the protective film 16 or the wiring layers 17A and 17B, the following advantages are obtained. First, a degree of freedom of selection of a vacuum film forming method can be improved. For example, even a metallic film forming method imparting high energy to deposition particles, such as a sputtering method, a CVD method, or the like, can be selected. This is because there is no fear of damage being caused to the surface of the organic semiconductor layer 14. In addition, an acid or a base that is strong to a certain degree can be used at the time of processing of the wiring layers 17A and 17B, so that an improvement in tact characteristic and lower cost can be achieved.

Description in the following will be made of other embodiments (second to fourth embodiments) of the present disclosure. Incidentally, the same constituent elements as in the foregoing first embodiment are identified by the same reference numerals, and description thereof will be omitted as appropriate.

Second Embodiment

[Constitution and Manufacturing Method of Thin Film Transistor 1A]

FIGS. 10A to 10F are plan views (X-Y plan views) showing an example of the constitution of a semiconductor element (thin film transistor 1A) according to a second embodiment and an example of main processes in a method of manufacturing the thin film transistor 1A according to the second embodiment in order of the processes.

The thin film transistor 1A according to the present embodiment basically has a similar constitution to that of the thin film transistor 1 except that the thin film transistor 1A according to the present embodiment has contact parts 18 to be described later. However, as will be described later in detail, in the thin film transistor 1A, both of source-drain electrodes 15A and 15B and wiring layers 17A and 17B are formed by a printing process (printing method).

In addition, in the thin film transistor 1A, unlike the thin film transistor 1, a gate electrode 12, a gate insulating film 13, an organic semiconductor layer 14, a pair of source-drain electrodes 15A and 15B, a pair of wiring layers 17A and 17B, and a protective film 16 are laminated on a substrate 11 in this order. This is because a method of forming the wiring layers 17A and 17B by a printing method after forming the protective film 16 makes printing difficult with too large surface depressions and projections.

In the present embodiment, first, as shown in FIGS. 10A to 10C, as in the first embodiment, the gate electrode 12 and gate wiring 12L are formed on the substrate 11, and a gate insulating film 13 not shown in the figures is formed on the gate electrode 12 and the gate wiring 12L. Then, as in the first embodiment, the organic semiconductor layer 14 in the form of an island is formed on the gate insulating film 13. However, unlike the first embodiment, the organic semiconductor layer 14 in the form of an island is formed also at a part of intersection of the gate wiring 12L and the wiring layers 17A and 17B at the time of formation of the organic semiconductor layer 14 to avoid the occurrence of a leakage current as described above.

Next, as shown in FIG. 10D, for example, the wiring layers 17A and 17B are formed by using a printing method such as a reverse offset printing method, for example. Specifically, Ag, for example, is directly patterned, and heat treatment is performed at a temperature of 140° C. for about one hour, for example. Incidentally, kinds of the material and the printing method for the wiring layers 17A and 17B are not limited to these examples.

Next, as shown in FIG. 10E, for example, the protective film 16 is formed as in the first embodiment. However, in consideration of a process shown in next FIG. 10F, the shape of the protective film 16 preferably has recessed parts 160 as described above. This is because the recessed parts 160 suppress the spread of minute liquid drops in a lateral direction (X-axis direction) when an ink is dropped into contact parts between the source-drain electrodes 15A and 15B and the wiring layers 17A and 17B by using an ink jet method in a subsequent process of FIG. 10F.

Thereafter, in the present embodiment, as shown in FIG. 10F, for example, contact parts 18 between the source-drain electrodes 15A and 15B and the wiring layers 17A and 17B are formed by using an ink jet method, for example. Specifically, a Ag nano-ink is dropped into the contact parts between the source-drain electrodes 15A and 15B and the wiring layers 17A and 17B by using the ink jet method, and after the dropping of the ink, heat treatment is performed at a temperature of 140° C. for about one hour, for example, whereby the contact parts 18 are formed. An excellent electric connection between the source-drain electrodes 15A and 15B and the wiring layers 17A and 17B is thus ensured. As a result of the above, the thin film transistor 1A according to the present embodiment is completed.

[Action and Effect of Thin Film Transistor 1A]

Also in the thin film transistor 1A, as in the thin film transistor 1, the source-drain electrodes 15A and 15B disposed on the organic semiconductor layer 14 so as to be in contact with the organic semiconductor layer 14 are formed separately from the wiring layers 17A and 17B electrically connected to the source-drain electrodes 15A and 15B. In other words, when the thin film transistor 1A is manufactured, the source-drain electrodes 15A and 15B are formed on the organic semiconductor layer 14 so as to be in contact with the organic semiconductor layer 14, and thereafter the wiring layers 17A and 17B electrically connected to the source-drain electrodes 15A and 15B are formed. Thus, the present embodiment can also provide similar effect to that of the first embodiment by action similar to that of the first embodiment.

Incidentally, in the present embodiment, when a Ag ink is used as an ink material for forming the wiring layers 17A and 17B, a strong seal needs to be provided (for example a glass seal) to prevent water from entering the wiring layers 17A and 17B. In such a case, the realization of a flexible circuit may not be possible. On the other hand, when a high-resistance material other than Ag is used as an ink material, the high-resistance material is considered to be applicable to a circuit with a short wiring length.

In the present embodiment, as described in the first embodiment, the formation of the source-drain electrodes 15A and 15B and the wiring layers 17A and 17B in separate processes has an advantage of preventing a break in the wiring layers 17A and 17B in the vicinity of the end parts of the organic semiconductor layer 14 from occurring easily. In addition, the formation of the source-drain electrodes 15A and 15B and the wiring layers 17A and 17B by only a printing process can reduce the number of processes as compared with a case of forming the wiring layers 17A and 17B by using photolithography technology and etching. It is also possible to use different kinds of ink, with the source-drain electrodes 15A and 15B formed by a conductive polymer such as PEDOT-PSS or the like and with the wiring layers 17A and 17B formed by Ag, for example. Because a suitable electrode material is not necessarily a suitable wiring material, there may be situations in which forming the source-drain electrodes 15A and 15B and the wiring layers 17A and 17B in separate processes is meaningful in its own way.

Third Embodiment

[Constitution and Manufacturing Method of Thin Film Transistor 1B]

FIGS. 11A to 11E are plan views (X-Y plan views) showing an example of the constitution of a semiconductor element (thin film transistor 1B) according to a third embodiment and an example of main processes in a method of manufacturing the thin film transistor 1B according to the third embodiment in order of the processes.

The thin film transistor 1B according to the present embodiment basically has a similar constitution to that of the thin film transistor 1. However, as will be described later in detail, in the thin film transistor 1B, source-drain electrodes 15A and 15B are formed by using a vacuum film forming process and photolithography technology (formed by vacuum film formation), while wiring layers 17A and 17B are formed by a printing process (printing method). Because the pattern formations of the wiring layers 17A and 17B are all performed by a printing method, the number of processes can be reduced as compared with a case where photolithography technology is used.

In addition, in the thin film transistor 1B, a gate electrode 12, a gate insulating film 13, an organic semiconductor layer 14, a pair of source-drain electrodes 15A and 15B, a pair of wiring layers 17A and 17B, and a protective film 16 are laminated on a substrate 11 in this order for the same reasons as in the second embodiment.

In the present embodiment, first, as shown in FIGS. 11A and 11B, as in the second embodiment, the gate electrode 12 and gate wiring 12L are formed on the substrate 11, and a gate insulating film 13 not shown in the figures is formed on the gate electrode 12 and the gate wiring 12L. Then, as in the second embodiment, the organic semiconductor layer 14 in the form of an island is formed on the gate insulating film 13.

Next, as shown in FIG. 11C, for example, the source-drain electrodes 15A and 15B are formed by using a vacuum film forming process and photolithography technology. Specifically, first, Ag is subjected to resistance heating evaporation as a metallic film to form the source-drain electrodes 15A and 15B, and a photoresist material is printed by a reverse offset printing method, whereby the patterns of the source-drain electrodes 15A and 15B are formed. Next, etching is performed with a potassium iodide solution, for example, and thereafter the photoresist is removed.

Next, as shown in FIGS. 11D and 11E, for example, as in the second embodiment, the wiring layers 17A and 17B and the protective film 16 are formed. As a result of the above, the thin film transistor 1B according to the present embodiment is completed.

[Action and Effect of Thin Film Transistor 1B]

Also in the thin film transistor 1B, as in the thin film transistor 1, the source-drain electrodes 15A and 15B disposed on the organic semiconductor layer 14 so as to be in contact with the organic semiconductor layer 14 are formed separately from the wiring layers 17A and 17B electrically connected to the source-drain electrodes 15A and 15B. In other words, when the thin film transistor 1B is manufactured, the source-drain electrodes 15A and 15B are formed on the organic semiconductor layer 14 so as to be in contact with the organic semiconductor layer 14, and thereafter the wiring layers 17A and 17B electrically connected to the source-drain electrodes 15A and 15B are formed. Thus, the present embodiment can also provide similar effect to that of the first embodiment by action similar to that of the first embodiment.

In addition, in the present embodiment, the formation of the source-drain electrodes 15A and 15B and the wiring layers 17A and 17B in separate processes can be said to have the following advantage in addition to the advantage described in the first embodiment. For example, when Au is used as a material for the source-drain electrodes 15A and 15B, an amount of expensive Au used can be reduced by limiting the use of Au to the source-drain electrodes 15A and 15B.

Fourth Embodiment

[Constitution and Manufacturing Method of Thin Film Transistor 1C]

FIGS. 12A to 12E are plan views (X-Y plan views) showing an example of the constitution of a semiconductor element (thin film transistor 1C) according to a fourth embodiment and an example of main processes in a method of manufacturing the thin film transistor 1C according to the fourth embodiment in order of the processes.

The thin film transistor 1C according to the present embodiment basically has a similar constitution to that of the thin film transistor 1. However, as will be described later in detail, in the thin film transistor 1C, both of source-drain electrodes 15A and 15B and wiring layers 17A and 17B are formed by using a vacuum film forming process and photolithography technology (formed by vacuum film formation).

Specifically, first, as shown in FIGS. 12A to 12C, as in the third embodiment, a gate electrode 12 and gate wiring 12L are formed on a substrate 11, and a gate insulating film 13 not shown in the figures is formed on the gate electrode 12 and the gate wiring 12L. Then, as in the third embodiment, an organic semiconductor layer 14 in the form of an island is formed on the gate insulating film 13, and thereafter the source-drain electrodes 15A and 15B are formed.

Next, as shown in FIG. 12D, for example, the wiring layers 17A and 17B are formed as in the first embodiment. Thereafter, as shown in FIG. 12E, for example, a protective film 16 is formed as in the third embodiment. As a result of the above, the thin film transistor 1C according to the present embodiment is completed.

[Action and Effect of Thin Film Transistor 1C]

Also in the thin film transistor 1C, as in the thin film transistor 1, the source-drain electrodes 15A and 15B disposed on the organic semiconductor layer 14 so as to be in contact with the organic semiconductor layer 14 are formed separately from the wiring layers 17A and 17B electrically connected to the source-drain electrodes 15A and 15B. In other words, when the thin film transistor 1C is manufactured, the source-drain electrodes 15A and 15B are formed on the organic semiconductor layer 14 so as to be in contact with the organic semiconductor layer 14, and thereafter the wiring layers 17A and 17B electrically connected to the source-drain electrodes 15A and 15B are formed. Thus, the present embodiment can also provide similar effect to that of the first embodiment by action similar to that of the first embodiment.

Fifth Embodiment

[General Constitution of Thin Film Transistor 1D]

Figure 13A:
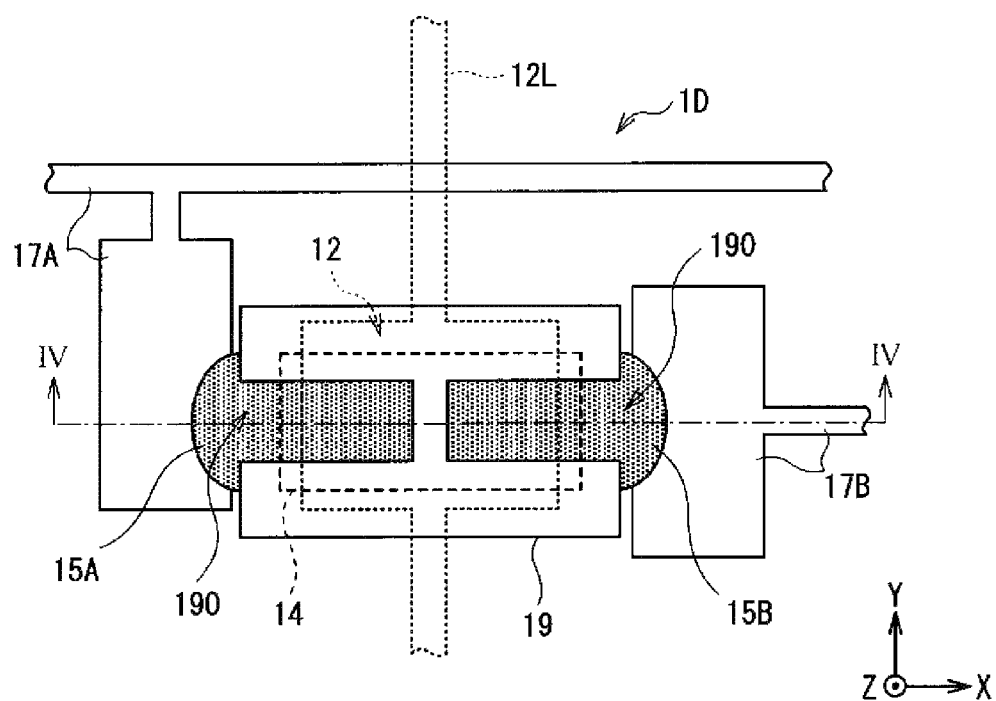
FIGS. 13A and 13B are diagrams showing an example of constitution of a thin film transistor according to a fifth embodiment.
Figure 13B:
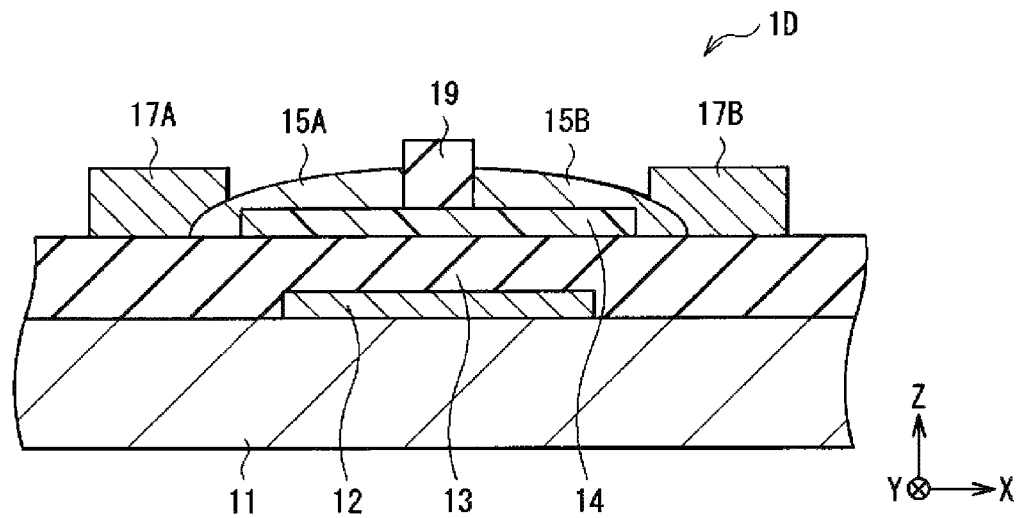

FIGS. 13A and 13B schematically show a general constitution of a semiconductor element (thin film transistor 1D) according to a fifth embodiment. Specifically, FIG. 13A shows a planar constitution (X-Y planar constitution). FIG. 13B shows a sectional constitution (Z-X sectional constitution) taken along a line IV-IV in the direction of arrows in FIG. 13A. As with the thin film transistors 1 and 1A to 1C described thus far, this thin film transistor 1D is also a top-contact staggered type organic TFT.

The thin film transistor 1D is for example formed by laminating a gate electrode 12, a gate insulating film 13, an organic semiconductor layer 14, a pair of source-drain electrodes 15A and 15B and a bank (etching stopper layer) 19, and a pair of wiring layers 17A and 17B in this order on a substrate 11.

The bank 19 is disposed so as to surround at least a part of the respective peripheries of the source-drain electrodes 15A and 15B. In this case, the bank 19 is disposed individually for each thin film transistor 1D (each element formation region). That is, each bank 19 is disposed only in the vicinity of the region of formation of each thin film transistor 1D. In other words, the bank 19 is disposed discontinuously (separately for each of regions of formation of thin film transistors 1D) on the substrate 11.

In addition, the bank 19 in this case has such a shape as to separate the pair of source-drain electrodes 15A and 15B from each other, and has opening parts 190 on the sides of the wiring layers 17A and 17B around parts of the peripheries of the source-drain electrodes 15A and 15B. That is, as shown in FIG. 13A, the bank 19 in this case has a shape of a capital letter H laid on its side. In other words, in this case, the region of formation of the bank 19 and the region of formation of the wiring layers 17A and 17B are not superposed on each other (do not overlap each other). The respective end parts (one end part) of the source-drain electrodes 15A and 15B project (protrude) from within the bank 19 through the opening parts 190 to the sides of the wiring layers 17A and 17B, whereby the source-drain electrodes 15A and 15B and the wiring layers 17A and 17B are electrically connected to each other. Incidentally, the projecting parts (protruding parts) of such source-drain electrodes 15A and 15B are formed naturally or intentionally at the time of formation of the source-drain electrodes 15A and 15B to be described later.

When the bank 19 of such a shape is used, the source-drain electrodes 15A and 15B are formed in a self-aligned manner (self-alignment formation), as will be described later. The bank 19 functions also as an etching stopper layer for a channel part in the organic semiconductor layer 14. Incidentally, such a bank 19 is desirably formed of a liquid-repellent material such as a fluorine (F) base resin material (such as $(C_6F_{10})_n$ or the like), for example.

[Method of Manufacturing Thin Film Transistor 1D]

The thin film transistor 1D can be manufactured as follows, for example. FIGS. 14A to 14J are plan views (X-Y plan views) showing an example of main processes in a method of manufacturing the thin film transistor 1D according to the present embodiment in order of the processes. Incidentally, the following description will be made by taking as an example a case where a capacitance element is formed together with the thin film transistor 1D.

First, as shown in FIG. 14A, a gate electrode 12 and gate wiring 12L are formed on a substrate 11. Thereafter, as shown in FIG. 14B, a gate insulating film 13 is formed on the gate electrode 12 and the gate wiring 12L. Next, as shown in FIGS. 14C and 14D, an organic semiconductor layer 14 in the shape of an island is formed on the gate insulating film 13 as in the first to fourth embodiments.

Next, as shown in FIG. 14E, a bank 19 functioning also as an etching stopper layer as described above is formed on the gate insulating film 13 and the organic semiconductor layer 14 in the shape of an island by using reverse offset printing, for example. Specifically, the bank 19 is formed by performing reverse offset printing using a liquid-repellent material such as a fluorine base resin, for example, and performing heating and drying for five minutes at a temperature of 120° C., for example. Incidentally, in the present example, the bank 19 is formed also on the periphery of a region of formation of the capacitance element (for example an auxiliary capacitance element). When an electrode (upper electrode) of the capacitance element is also thus formed by using a printing method, as will be described in the following, the formation of wiring layers 17A and 17B to be described later by a printing method (gravure printing in this case) is made easier. This is because with gravure printing, a simple pattern is printed easily, but it is difficult to print a pattern of straight lines orthogonal to each other or a pattern in which a square and a straight line are mixed with each other, for example.

Next, as indicated by a reference P4 in FIG. 14F, an ink made of a constituent material for source-drain electrodes 15A and 15B (and the electrode of the capacitance element) is dropped and filled into the inside of the bank 19 using a printing process (an ink jet method in this case). In this manner, as shown in FIG. 14G, for example, the ink dropped inside the bank 19 wets and spreads, so that the source-drain electrodes 15A and 15B and the like are formed in a self-aligned manner by using the bank 19. At this time, in this case, the end part (one end part) of the source-drain electrode 15A projects (protrudes) from within the bank 19 through the opening part 190 to the side of a region in which a wiring layer 17A is intended to be formed. Such a projecting part (protruding part) functions as a part (contact part) for electrically connecting the source-drain electrode 15A to the wiring layer 17A. Incidentally, at this time, the whole of the organic semiconductor layer 14 in the shape of an island is desirably covered completely by the source-drain electrodes 15A and 15B and the bank 19 functioning also as an etching stopper layer. This is for the protection of a channel part at a subsequent time of formation of the wiring layers 17A and 17B.

Figure 14H:
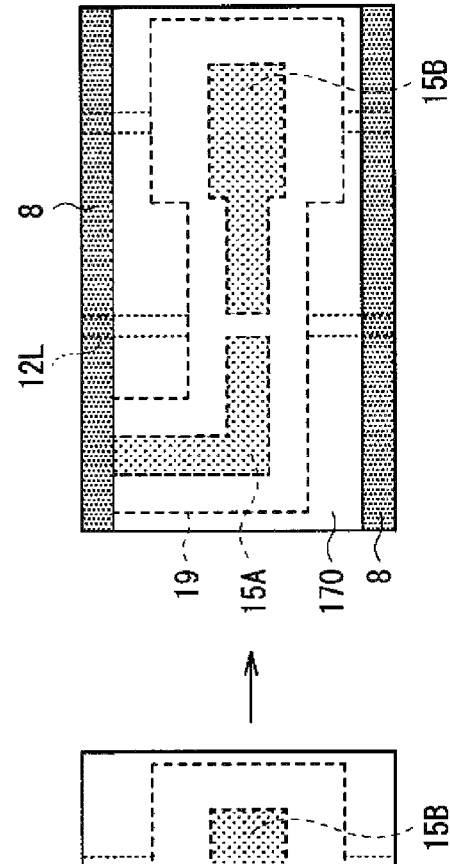
Figure 14I:
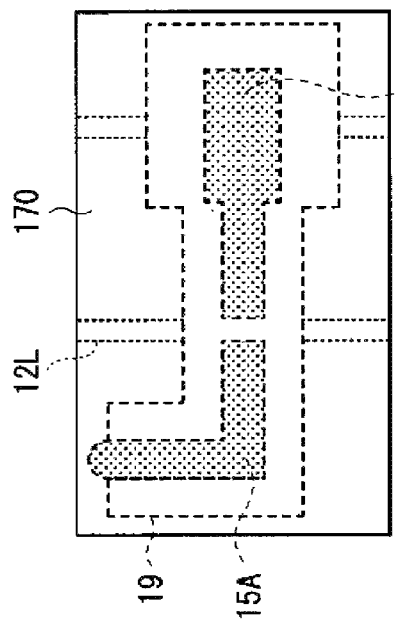
Figure 14J:
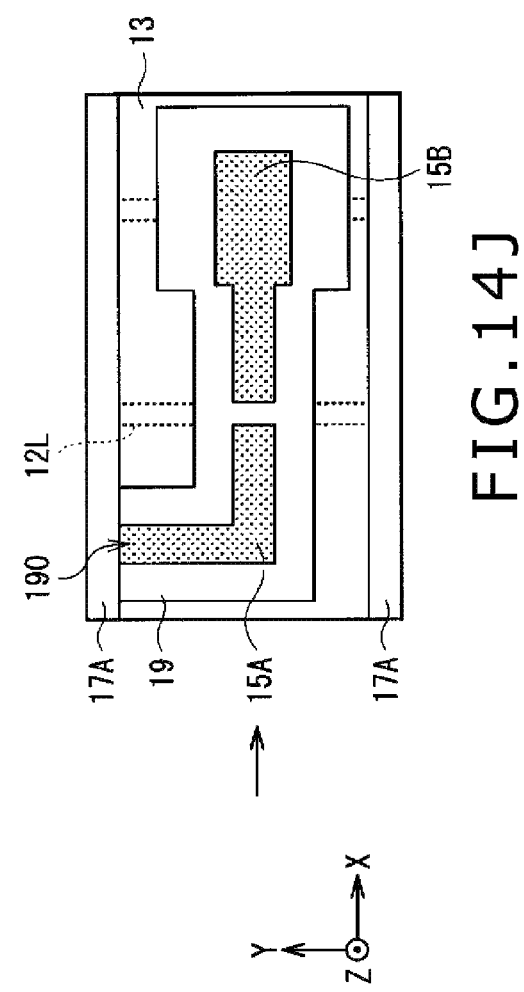

Next, as shown in FIG. 14H, a wiring layer 170 is formed on the entire surface by using a sputtering method, for example. Thereafter, as shown in FIG. 14I, a resist film 8 is pattern-printed into the shape of the wiring layers 17A and 17B. Next, using a mixed acid of a nitric acid, a hydrofluoric acid, and a phosphoric acid, for example, the wiring layer 170 is wet-etched, and thereafter the resist film 8 is dissolved and removed, whereby the wiring layers 17A and 17B are formed as shown in FIG. 14J. As a result of the above, the thin film transistor 1D and the like shown in FIGS. 13A and 13B are completed.

[Action and Effect of Thin Film Transistor 1D]

Also in the thin film transistor 1D, as in the thin film transistor 1, the source-drain electrodes 15A and 15B disposed on the organic semiconductor layer 14 so as to be in contact with the organic semiconductor layer 14 are formed separately from the wiring layers 17A and 17B electrically connected to the source-drain electrodes 15A and 15B. In other words, when the thin film transistor 1D is manufactured, the source-drain electrodes 15A and 15B are formed on the organic semiconductor layer 14 so as to be in contact with the organic semiconductor layer 14, and thereafter the wiring layers 17A and 17B electrically connected to the source-drain electrodes 15A and 15B are formed. Thus, the present embodiment can also provide similar effect to that of the first embodiment by action similar to that of the first embodiment.

In addition, in the present embodiment, the source-drain electrodes 15A and 15B are formed in a self-aligned manner by ink jet printing using the bank 19. Therefore, an effect of reduction in material cost through the adoption of ink jet printing is obtained while the position at the time of dropping the ink is controlled. That is, it is possible to manufacture an element formed of a minute pattern while reducing manufacturing cost. In addition, because of the method of dropping the ink, the fear of a break in the wiring layers 17A and 17B and the like is reduced even when the substrate 11 has depressions and projections thereon. In addition, in this case, the bank 19 functions also as an etching stopper layer, and thus it is not that such a bank 19 is provided only for use as the bank 19 (a process of formation of the bank 19 is omitted in effect). Therefore the manufacturing cost is further reduced. Moreover, when not only the source-drain electrodes 15A and 15B but also the wiring layers 17A and 17B and the like are formed by printing, for example, the source-drain electrodes 15A and 15B but also the wiring layers 17A and 17B and the like can be formed without the use of photolithography technology. An effect of further reduction in manufacturing cost is therefore obtained.

Further, in the present embodiment, the bank 19 is provided individually for each thin film transistor 1D (each element formation region). That is, each bank 19 is disposed only in the vicinity of the region of formation of each thin film transistor 1D. In other words, the bank 19 is disposed discontinuously (separately for each of regions of formation of thin film transistors 1D) on the substrate 11. When the bank 19 is formed of the liquid-repellent material described above, the following effects are also obtained. An effect of reducing processes is obtained because the presence of the liquid-repellent bank 19 only in the vicinity of the thin film transistor 1D eliminates a need for special hydrophilic treatment at a time of formation of the layer structure of the source-drain electrodes 15A and 15B and the wiring layers 17A and 17B and the like. In addition, structural reliability of the whole of an electric circuit on the substrate 11 is improved as compared with a case where a thin film forming the liquid-repellent bank 19 is present over the whole of the substrate 11. This is because the widespread presence of the liquid-repellent bank 19 over the surface of the substrate 11 makes it difficult to form a coating film (interlayer insulating film or the like) on the liquid-repellent bank 19. In addition, even if the coating film can be formed, an adhesion between the interlayer insulating film or the like and the film of the liquid-repellent bank 19 is generally weak. The film therefore tends to be peeled off easily at the interface, thus resulting in structural vulnerability.

In addition, the alignment of the source-drain electrodes 15A and 15B with the etching stopper layer, which alignment in particular is desired to be accurate, is performed in a self-aligned manner. A problem of insufficient alignment accuracy in a printing machine is therefore alleviated. Incidentally, when the alignment between the bank 19 functioning also as an etching stopper layer and the source-drain electrodes 15A and 15B is performed correctly, the fear of a short circuit (short) between the source-drain electrodes 15A and 15B is avoided, as shown in FIG. 15A, for example. On the other hand, as shown in FIG. 15B, for example, in a case where alignment between the bank 19 and the source-drain electrodes 15A and 15B is not achieved, there is a fear of a short circuit between the source-drain electrodes 15A and 15B when the source-drain electrodes 15A and 15B are formed by ink jet printing.

Examples of Modification of Fifth Embodiment

Examples of modification (first to third examples of modification) of the foregoing fifth embodiment will hereinafter be described. Methods of formation of the source-drain electrodes 15A and 15B, the wiring layers 17A and 17B, and the like in the first and second examples of modification among the first to third examples of modification are different from that of the fifth embodiment. That is, the constitution of the thin film transistor 1D itself is basically similar to that of the thin film transistor 1D described in the fifth embodiment. Incidentally, the same constituent elements as in the fifth embodiment are identified by the same references, and description thereof will be omitted as appropriate.

First Example of Modification

FIGS. 16A to 16F are plan views (X-Y plan views) showing an example of main processes in a method of manufacturing the thin film transistor 1D according to the first example of modification in order of the processes. In the present example of modification, wiring layers 17A and 17B are formed using resist pattern formation by reverse offset printing, and thereafter source-drain electrodes 15A and 15B are formed by using ink jet printing. The source-drain electrodes 15A and 15B are formed by using ink jet printing after the formation of the wiring layers 17A and 17B because printing on a surface with depressions and projections is difficult in the case of the reverse offset printing method.

Figure 16A:
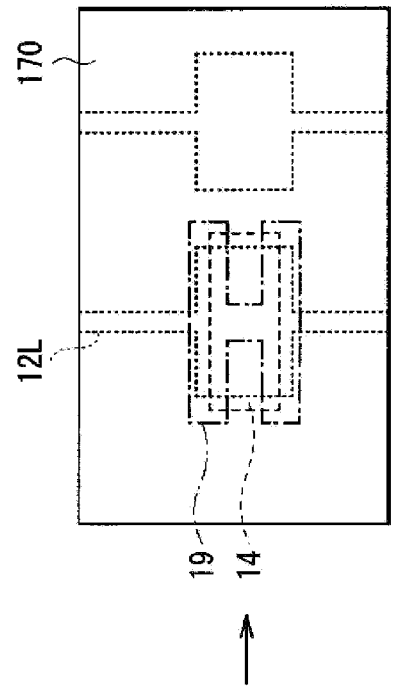

In the present example of modification, first, as shown in FIG. 16A, as in the fifth embodiment, a gate electrode 12 and gate wiring 12L are formed on a substrate 11, and thereafter a gate insulating film 13, an organic semiconductor layer 14 in the shape of an island, and a bank 19 are formed on the gate electrode 12 and the gate wiring 12L.

Figure 16B:
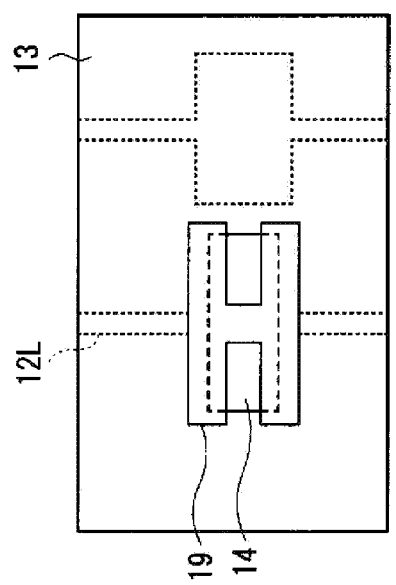
Figure 16C:
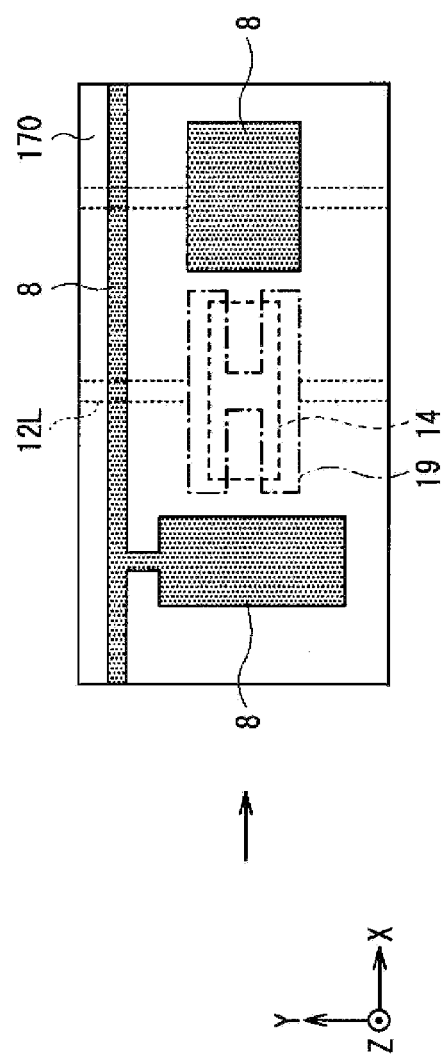

Next, as shown in FIG. 16B, a wiring layer 170 is formed on the entire surface by using a sputtering method, for example. Thereafter, as shown in FIG. 16C, a resist film 8 is pattern-printed into the shape of the wiring layers 17A and 17B. Next, using a mixed acid of a nitric acid, a hydrofluoric acid, and a phosphoric acid, for example, the wiring layer 170 is wet-etched, and thereafter the resist film 8 is dissolved and removed, whereby the wiring layers 17A and 17B are formed as shown in FIG. 16D.

Next, as indicated by a reference P4 in FIG. 16E, an ink made of a constituent material for source-drain electrodes 15A and 15B is dropped and filled into the inside of the bank 19 using a printing process (an ink jet method in this case). Thus, as shown in FIG. 16F, for example, the ink dropped inside the bank 19 wets and spreads, so that the source-drain electrodes 15A and 15B are formed in a self-aligned manner by using the bank 19. At this time, in this case, the respective end parts (one end part) of the source-drain electrodes 15A and 15B project (protrude) from within the bank 19 through opening parts 190 to the sides of the wiring layers 17A and 17B. Such projecting parts (protruding parts) function as parts (contact parts) for electrically connecting the source-drain electrodes 15A and 15B to the wiring layers 17A and 17B.

Also in the present example of modification using such a manufacturing method, similar effects to those of the foregoing fifth embodiment can be obtained by action similar to that of the foregoing fifth embodiment.

Second Example of Modification

FIGS. 17A to 17E are plan views (X-Y plan views) showing an example of main processes in a method of manufacturing the thin film transistor 1D according to the second example of modification in order of the processes. In the present example of modification, source-drain electrodes 15A and 15B are formed by using ink jet printing, and thereafter wiring layers 17A and 17B are formed by using a laser ablation method.

In the present example of modification, first, as shown in FIG. 17A, as in the fifth embodiment, a gate electrode 12 and gate wiring 12L are formed on a substrate 11, and thereafter a gate insulating film 13, an organic semiconductor layer 14 in the shape of an island, and a bank 19 are formed on the gate electrode 12 and the gate wiring 12L.

Next, as indicated by a reference P4 in FIG. 17B, an ink made of a constituent material for source-drain electrodes 15A and 15B is dropped and filled into the inside of the bank 19 using a printing process (an ink jet method in this case). Thus, as shown in FIG. 17C, for example, the ink dropped inside the bank 19 wets and spreads, so that the source-drain electrodes 15A and 15B are formed in a self-aligned manner by using the bank 19. At this time, in this case, the respective end parts (one end part) of the source-drain electrodes 15A and 15B project (protrude) from within the bank 19 through opening parts 190 to the sides of regions in which the wiring layers 17A and 17B are intended to be formed. Such projecting parts (protruding parts) function as parts (contact parts) for electrically connecting the source-drain electrodes 15A and 15B to the wiring layers 17A and 17B.

Figure 17D:
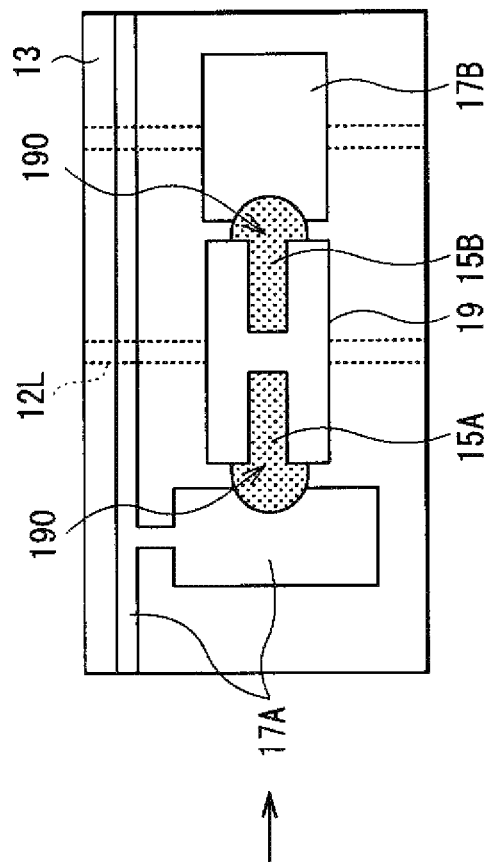
Figure 17E:
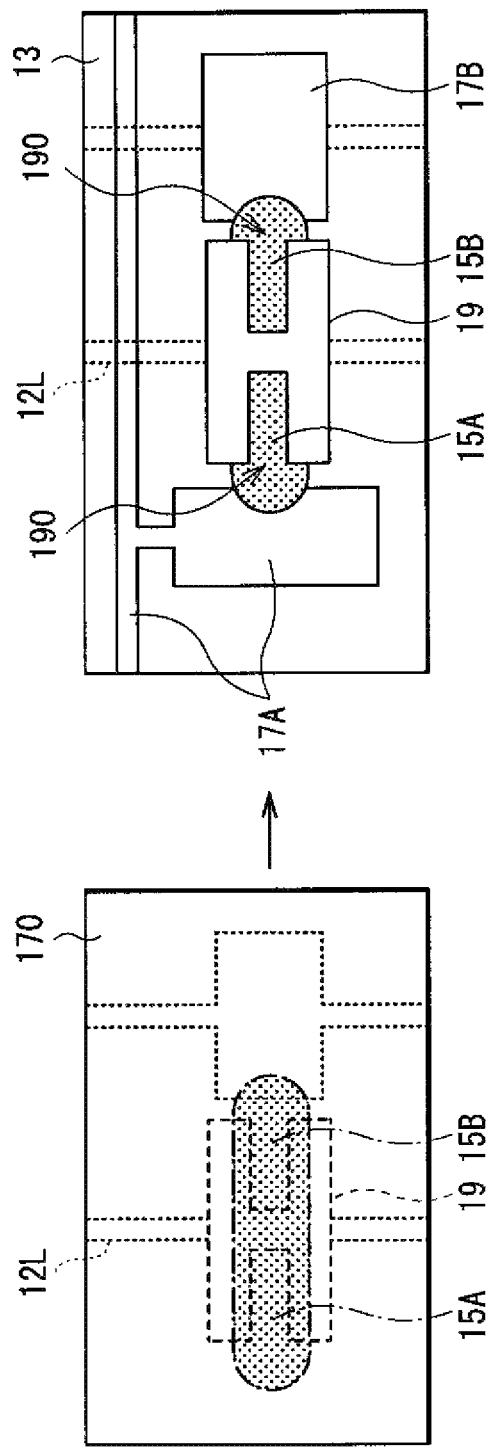

Next, as shown in FIG. 17D, a wiring layer 170 is formed on the entire surface by using a sputtering method, for example. Thereafter, the wiring layer 170 is patterned by using a laser ablation method. The wiring layers 17A and 17B are thereby formed as shown in FIG. 17E.

Also in the present example of modification using such a manufacturing method, similar effects to those of the foregoing fifth embodiment can be obtained by action similar to that of the foregoing fifth embodiment.

Third Example of Modification

FIGS. 18A to 18C are plan views (X-Y plan views) showing an example of constitution of a bank 19A in a thin film transistor according to the third example of modification and an example of main processes in a method of manufacturing the thin film transistor using the bank 19A in order of the processes.

Also in the present example of modification, as in the fifth embodiment, source-drain electrodes 15A and 15B are formed in a self-aligned manner by ink jet printing using the bank 19A functioning also as an etching stopper layer. However, unlike the bank 19 described thus far, the bank 19A according to the present example of modification does not have opening parts 190. That is, the bank 19A is disposed so as to surround all parts of the respective peripheries of the source-drain electrodes 15A and 15B. Incidentally, as with the bank 19, the bank 19A is provided individually for each thin film transistor (each element formation region).

Also in the present example of modification using the bank 19A of such a shape, similar effects to those of the foregoing fifth embodiment can be obtained by action similar to that of the foregoing fifth embodiment.

However, when the bank 19A of such a shape is used, as shown in FIG. 19A, for example, the region of formation of the bank 19A and the regions of formation of the wiring layers 17A and 17B are superposed on each other (overlap each other) at end parts of the bank 19A. Then, the respective end parts (one end part) of the source-drain electrodes 15A and 15B are electrically connected to the wiring layers 17A and 17B within the bank 19A (regions of superposition described above) (see an arrow P51 in FIG. 19A). In this case, however, as indicated by a reference P6 in FIG. 19A, for example, a level difference is formed in the bank 19A and the source-drain electrodes 15A and 15B within the bank 19A at edge parts of the wiring layers 17A and 17B. A break in the source-drain electrodes 15A and 15B tends to occur at such level difference parts. Thus, it can be said that the level difference is not desirable from a viewpoint of reliability.

On the other hand, as shown in FIG. 19B, in the case of the bank 19 according to the fifth embodiment, the region of formation of the bank 19 and the regions of formation of the wiring layers 17A and 17B are not superposed on each other (do not overlap each other). Then, the respective end parts (one end part) of the source-drain electrodes 15A and 15B project (protrude) from within the bank 19 through opening parts 190 to the sides of the wiring layers 17A and 17B, whereby the source-drain electrodes 15A and 15B are electrically connected to the wiring layers 17A and 17B (see a reference P52 in FIG. 19B). Thus, when the bank 19 is used, no level difference is formed in the source-drain electrodes 15A and 15B, and it can therefore be said that reliability can be improved as compared with the case of using the bank 19A as in FIG. 19A.

Sixth Embodiment

[General Constitution of Thin Film Transistor 1E]

FIG. 20 schematically shows a general constitution (Z-X sectional constitution) of a semiconductor element (thin film transistor 1E) according to a sixth embodiment. Unlike the thin film transistors 1 and 1A to 1D described thus far, this thin film transistor 1E is a bottom-contact staggered type organic TFT.

The thin film transistor 1E is for example formed by laminating a gate electrode 12, a gate insulating film 13, a pair of source-drain electrodes 15A and 15B and an organic semiconductor layer 14 and a pair of wiring layers 17A and 17B in this order on a substrate 11.

Also in the thin film transistor 1E, as in the thin film transistors 1 and 1A to 1D, the source-drain electrodes 15A and 15B in contact with the organic semiconductor layer 14 are formed separately from the wiring layers 17A and 17B electrically connected to the source-drain electrodes 15A and 15B. However, while the source-drain electrodes 15A and 15B in the thin film transistors 1 and 1A to 1D are on the organic semiconductor layer 14 and in contact with the organic semiconductor layer 14, the source-drain electrodes 15A and 15B in the thin film transistor 1E are in a layer under the organic semiconductor layer 14 and in contact with the organic semiconductor layer 14.

In addition, the source-drain electrodes 15A and 15B in the thin film transistor 1E are each formed by dropping and filling a constituent material (ink) for the source-drain electrodes 15A and 15B into the inside of a bank of a predetermined shape (the bank 19 or the bank 19A). Then, the organic semiconductor layer 14 in the thin film transistor 1E is formed on the source-drain electrodes 15A and 15B after removal of the above-described bank. That is, unlike the thin film transistor 1D, the bank is ultimately removed and does not remain in the thin film transistor 1E. However, the present disclosure is not limited to the case of forming the source-drain electrodes 15A and 15B thus using the bank, but the source-drain electrodes 15A and 15B may be formed without the use of the bank.

[Method of Manufacturing Thin Film Transistor 1E]

The thin film transistor 1E can be manufactured as follows, for example. FIGS. 21A to 21D are plan views (X-Y plan views) showing an example of main processes in a method of manufacturing the thin film transistor 1E according to the present embodiment in order of the processes.

First, as shown in FIG. 21A, a gate electrode 12 and gate wiring 12L are formed on a substrate 11, and a gate insulating film 13 is formed on the gate electrode 12 and the gate wiring 12L. Then, source-drain electrodes 15A and 15B are formed on the gate insulating film 13 by a printing process (ink jet printing) using a bank as described above, for example. Incidentally, when the source-drain electrodes 15A and 15B are thus formed by using the bank, the bank is thereafter removed.

Next, as shown in FIG. 21B, an organic semiconductor layer 14 in the shape of an island is formed on the gate insulating film 13 and the source-drain electrodes 15A and 15B by using a printing method such as flexography, for example. Next, as shown in FIG. 21C, an etching stopper layer 19B made of a fluorine base resin or the like is formed so as to cover the entire surface of the organic semiconductor layer 14 by a printing method such as a reverse offset printing method, for example.

Thereafter, a wiring layer 170 is formed on the entire surface by using a sputtering method, for example, and for example a resist film 8 is pattern-printed into the shape of wiring layers 17A and 17B. Next, using a mixed acid of a nitric acid, a hydrofluoric acid, and a phosphoric acid, for example, the wiring layer 170 is wet-etched, and thereafter the resist film 8 is dissolved and removed, whereby the wiring layers 17A and 17B are formed as shown in FIG. 21D. As a result of the above, the thin film transistor 1E according to the present embodiment is completed.

[Action and Effect of Thin Film Transistor 1E]

Also in the thin film transistor 1E, as in the thin film transistors 1 and 1A to 1D, the source-drain electrodes 15A and 15B disposed on the organic semiconductor layer 14 so as to be in contact with the organic semiconductor layer 14 are formed separately from the wiring layers 17A and 17B electrically connected to the source-drain electrodes 15A and 15B. In other words, when the thin film transistor 1E is manufactured, the source-drain electrodes 15A and 15B in contact with the organic semiconductor layer 14 are formed in a separate process from that of the wiring layers 17A and 17B electrically connected to the source-drain electrodes 15A and 15B.

The present embodiment can thus reduce wiring resistance in the wiring layers 17A and 17B while suppressing contact resistance between the organic semiconductor layer 14 and the source-drain electrodes 15A and 15B as compared with a case where the source-drain electrodes 15A and 15B are formed integrally with (in a same process as) the wiring layers 17A and 17B, as will be described in the following, for example. Thus, as with the first to fifth embodiments and the like, the present embodiment can also improve reliability (reduce manufacturing defects).

Specifically, in a thin film transistor 401 according to a fourth example of comparison shown in FIG. 22A, for example, source-drain electrodes 15A and 15B functioning also as wiring layers 17A and 17B have a large film thickness, and therefore the wiring resistance of the source-drain electrodes 15A and 15B is lowered. However, there is a fear of an increase in contact resistance and a decrease in reliability (increase of manufacturing defects) as a result of the crystal of a semiconductor in the organic semiconductor layer 14 being disordered, for example, in level difference parts of the source-drain electrodes 15A and 15B which parts are indicated by a reference P71 in FIG. 22A.

On the other hand, in a thin film transistor 501 according to a fifth example of comparison shown in FIG. 22B, for example, as indicated by a reference P72 in FIG. 22B, source-drain electrodes 15A and 15B functioning also as wiring layers 17A and 17B have a small film thickness. Therefore, as compared with the foregoing fourth example of comparison, contact resistance at the level difference parts of the source-drain electrodes 15A and 15B is lowered, so that reliability is improved (manufacturing defects are reduced) in this respect. However, the small film thickness of the source-drain electrodes 15A and 15B functioning also as the wiring layers 17A and 17B means that wiring resistance is increased as compared with the foregoing fourth example of comparison. Thus, a problem in reliability may occur in this respect.

In contrast to the fourth and fifth examples of comparison, the present embodiment enables the film thickness of the source-drain electrodes 15A and 15B separate from the wiring layers 17A and 17B to be reduced while enabling the film thickness of the wiring layers 17A and 17B to be increased. Thus, as described above, the present embodiment can reduce wiring resistance while suppressing contact resistance.

EXAMPLES OF APPLICATION

Description will next be made of examples of application of the semiconductor element (thin film transistor 1 or 1A to 1E) described in each of the foregoing embodiments and examples of modification (examples of application to display devices and electronic devices).
[Display Device]

Figure 23A:
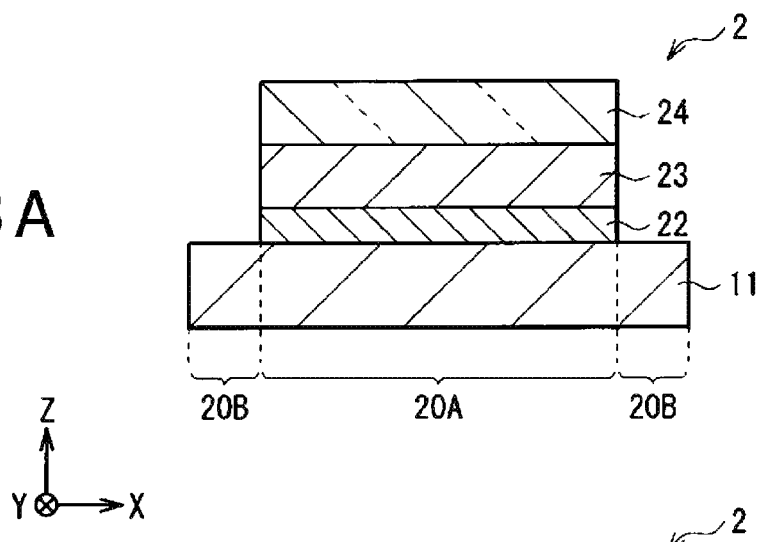
FIGS. 23A and 23B are diagrams showing an example of application of the thin film transistor according to each embodiment and each example of modification to a display device.
Figure 23B:
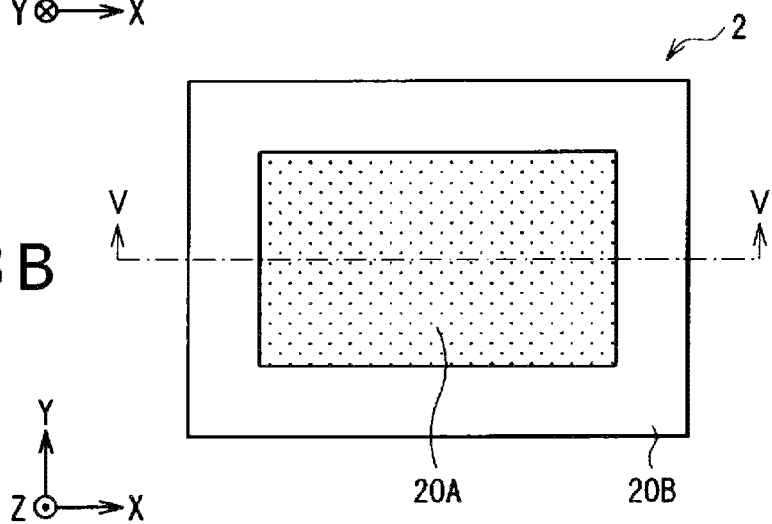

FIGS. 23A and 23B schematically show a general constitution of a display device (display device 2) having the semiconductor element (thin film transistor 1 or 1A to 1E) according to each of the foregoing embodiments. Specifically, FIG. 23B shows a planar constitution (X-Y planar constitution). FIG. 23A shows a sectional constitution (Z-X sectional constitution) taken along a line VI-VI in the direction of arrows in FIG. 23B.

This display device 2 is formed by laminating a substrate 11, a TFT layer 22, a display layer 23, and a transparent substrate 24 in this order. Specifically, the TFT layer 22, the display layer 23, and the transparent substrate 24 are laminated on a display region 20A in the substrate 11, while the TFT layer 22, the display layer 23, and the transparent substrate 24 are not laminated on a frame region (non-display region) 20B in the substrate 11.

The TFT layer 22 includes a plurality of devices including thin films (a conductive film such as a metallic film or the like, an insulating film, and the like). The devices include for example a TFT as a switching element for selecting a pixel as well as a capacitance element (a storage capacitor element and the like), wiring (a scanning line, a signal line, and the like), and electrodes (a pixel electrode and the like). The TFT in this case is formed by the thin film transistor (organic TFT) according to each of the foregoing embodiments using the organic semiconductor layer 14 as a channel layer.

The display layer 23 includes electrophoretic particles, a liquid crystal layer, an organic EL (Electro Luminescence) layer, an inorganic EL layer, or the like between a pixel electrode and a common electrode, for example. That is, the display layer 23 is formed by using an electrophoretic element, a liquid crystal element, an organic EL element, an inorganic EL element, or the like. Incidentally, the pixel electrode is disposed in the TFT layer 22 in each pixel, and the common electrode is disposed over one surface of the transparent substrate 24.

The transparent substrate 24 is for example formed by using a material similar to that of the substrate 11. Incidentally, a moisture preventing film for preventing the entry of water into the display layer 23 and an optically functional film for preventing a glare of extraneous light on a display surface may be further provided on the transparent substrate 24.
[Electronic Device]

Examples of application of the above-described display device 2 will next be described with reference to FIGS. 24A to 29G. This display device 2 is applicable to electronic devices in all fields such as television devices, digital cameras, notebook personal computers, portable terminal devices such as portable telephones and the like, video cameras, and the like. In other words, the display device 2 is applicable to electronic devices in all fields that display an externally input video signal or a video signal generated within the electronic devices as a still image or video.

First Example of Application

Figure 24A:
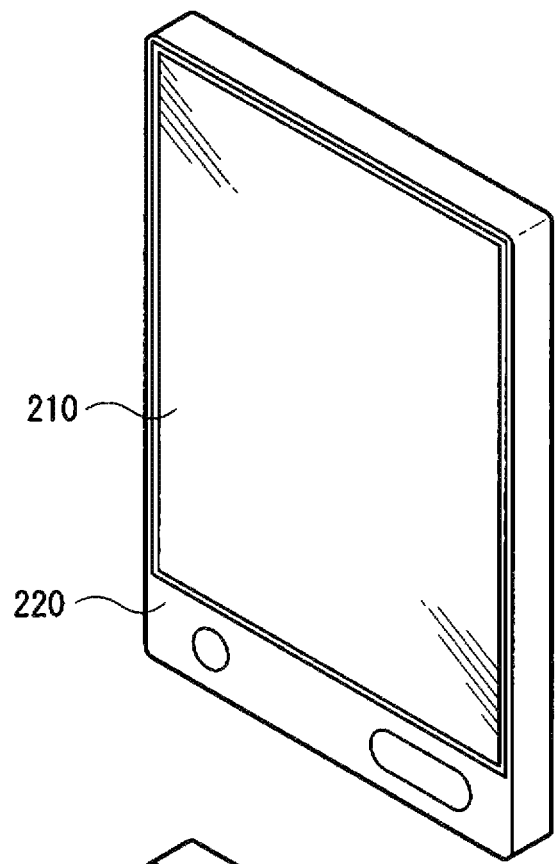
FIGS. 24A and 24B are perspective views of an external appearance of a first example of application of the display device shown in FIGS. 23A and 23B to an electronic device.
Figure 24B:
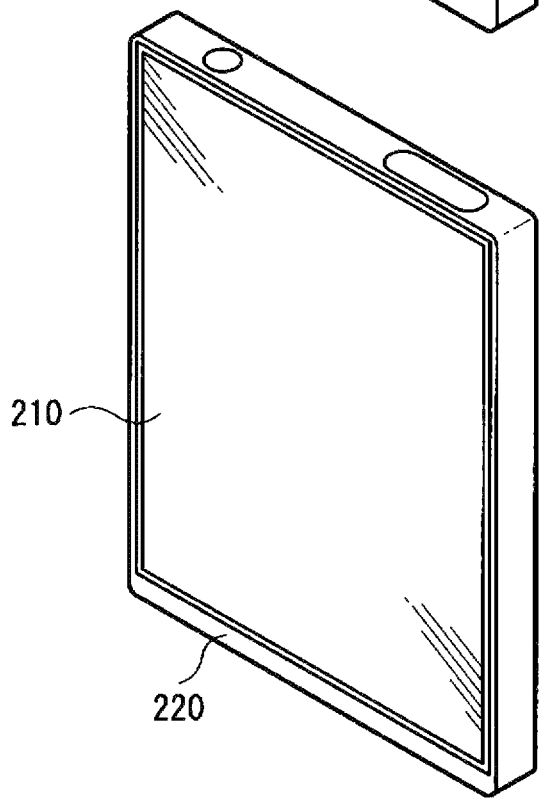

FIG. 24A and FIG. 24B each show an external appearance of an electronic book to which the display device 2 is applied. The electronic book has for example a display section 210 and a non-display section 220. The display section 210 is formed by the display device 2.

Second Example of Application

Figure 25:
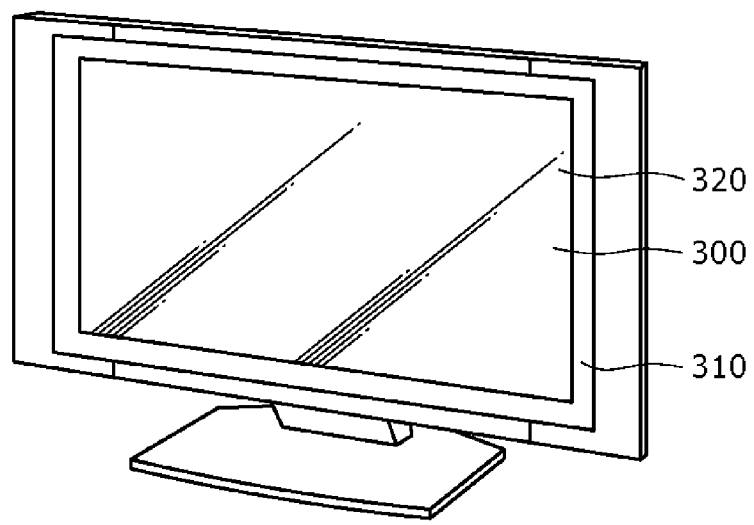
FIG. 25 is a perspective view of an external appearance of a second example of application.

FIG. 25 shows an external appearance of a television device to which the display device 2 is applied. This television device has for example a video display screen section 300 including a front panel 310 and a filter glass 320. The video display screen section 300 is formed by the display device 2.

Third Example of Application

Figure 26A:
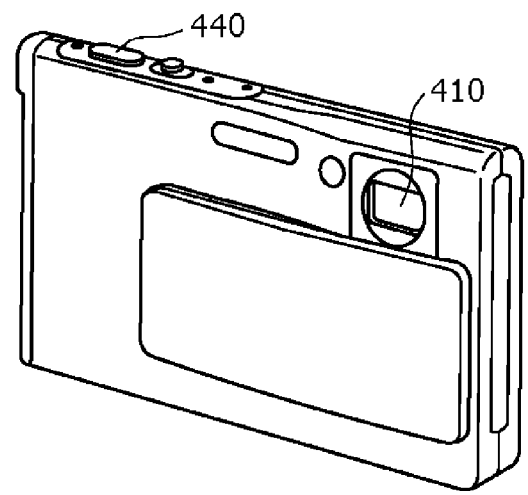
FIG. 26A is a perspective view of an external appearance of a third example of application as viewed from a front side.
Figure 26B:
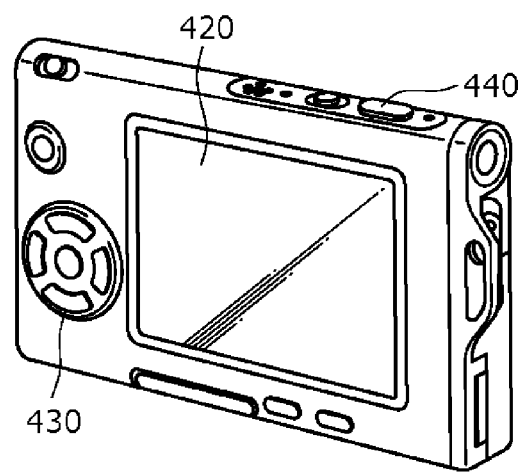
FIG. 26B is a perspective view of the external appearance of the third example of application as viewed from a back side.

FIGS. 26A and 26B show an external appearance of a digital camera to which the display device 2 is applied. This digital camera has for example a light emitting section 410 for flashlight, a display section 420, a menu switch 430, and a shutter button 440. The display section 420 is formed by the display device 2.

Fourth Example of Application

Figure 27:
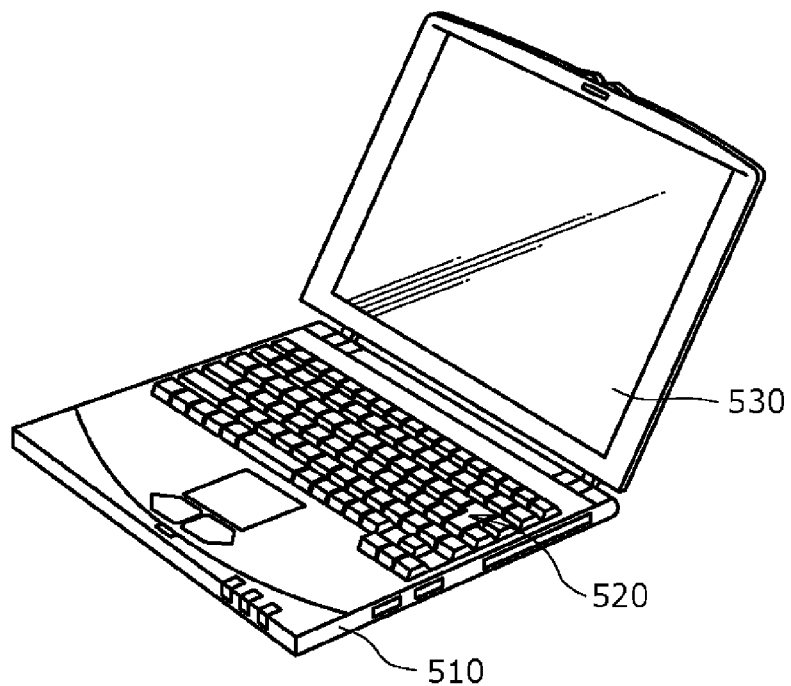
FIG. 27 is a perspective view of an external appearance of a fourth example of application.

FIG. 27 shows an external appearance of a notebook personal computer to which the display device 2 is applied. This notebook personal computer has for example a main unit 510, a keyboard 520 for operations of inputting characters and the like, and a display section 530 for displaying an image. The display section 530 is formed by the display device 2.

Fifth Example of Application

Figure 28:
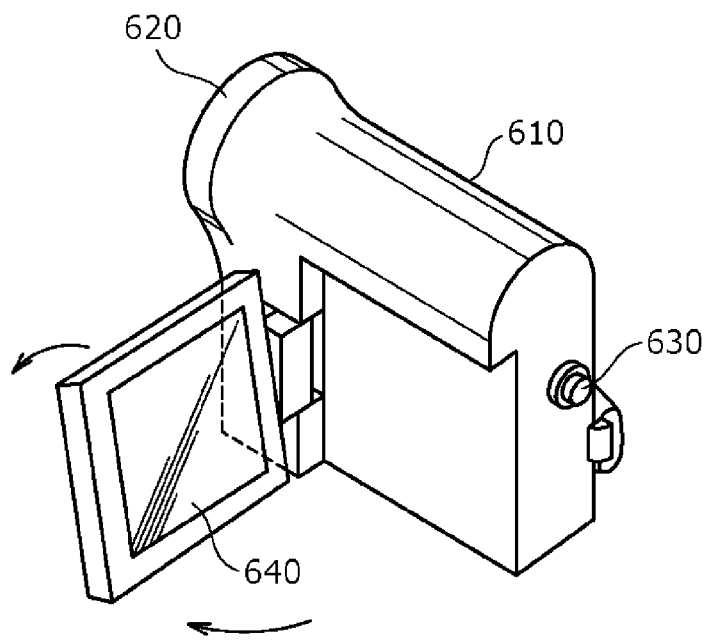
FIG. 28 is a perspective view of an external appearance of a fifth example of application.

FIG. 28 shows an external appearance of a video camera to which the display device 2 is applied. This video camera has for example a main body section 610, a lens 620 for taking a subject, which lens is disposed in a front side surface of the main body section 610, a start/stop switch 630 at a time of picture taking, and a display section 640. The display section 640 is formed by the display device 2.

Sixth Example of Application

FIGS. 29A to 29G show an external appearance of a portable telephone to which the display device 2 is applied. This portable telephone is for example formed by coupling an upper side casing 710 and a lower side casing 720 to each other by a coupling part (hinge part) 730. The portable telephone has a display 740, a sub-display 750, a picture light 760, and a camera 770. Of these parts, the display 740 or the sub-display 750 is formed by the display device 2.

Other Examples of Modification

The technology according to the embodiments of the present disclosure has been described above by citing some embodiments, examples of modification and examples of application thereof. However, the present disclosure is not limited to these embodiments and the like, but is susceptible of various modifications.

For example, the materials and thicknesses or the film forming methods and film forming conditions or the like of the respective layers described in the foregoing embodiments and the like are not limited, but may be other materials and thicknesses or other film forming methods and film forming conditions. In addition, while the foregoing embodiments and the like have been described by citing concrete constitutions of display devices, not all the layers need to be provided, and other layers may be further provided.

In addition, the foregoing embodiments and the like have been described by taking a thin film transistor (organic TFT) including an organic semiconductor layer, a gate electrode, a pair of source-drain electrodes, and a wiring layer as an example of a semiconductor element according to the embodiments of the present disclosure, but are not limited to this. That is, the present disclosure is applicable to other semiconductor elements such as diodes (rectifying elements) and the like including an organic semiconductor layer, a pair of electrodes (an anode electrode and a cathode electrode), and a wiring layer, for example.

Incidentally, the present disclosure can also adopt the following constitutions.

(1) A semiconductor element including:
an organic semiconductor layer;
an electrode disposed on the organic semiconductor layer so as to be in contact with the organic semiconductor layer; and
a wiring layer formed separately from the electrode and electrically connected to the electrode.

(2) The semiconductor element according to the above (1), wherein the semiconductor element includes
the organic semiconductor layer,
a gate electrode,
a pair of source-drain electrodes as the electrode, and
the wiring layer, and
is formed as a thin film transistor.

(3) The semiconductor element according to the above (2), further including:
a gate insulating film and
a protective film,
wherein the gate electrode, the gate insulating film, the organic semiconductor layer, the source-drain electrodes, the protective film, and the wiring layer are laminated on a substrate in order of the gate electrode, the gate insulating film, the organic semiconductor layer, the source-drain electrodes, the protective film, and the wiring layer.

(4) The semiconductor element according to the above (3), wherein the organic semiconductor layer has projection parts as regions overlapping the source-drain electrodes outside a region of formation of the protective film.

(5) The semiconductor element according to the above (3), wherein the protective film has recessed parts as notch regions, and
the organic semiconductor layer and the source-drain electrodes overlap each other in the notch regions.

(6) The semiconductor element according to any one of the above (3) to (5),
wherein one of the organic semiconductor layer and the protective film is disposed in a region of overlap between the gate electrode and the wiring layer.

(7) The semiconductor element according to any one of the above (3) to (6),
wherein an external shape line of the organic semiconductor layer is disposed on an inside of an external shape line of the gate electrode in a region connecting a pair of wiring layers as the wiring layer to each other, the pair of wiring layers being connected to the pair of source-drain electrodes, respectively.

(8) The semiconductor element according to any one of the above (2) to (7),
wherein the pair of source-drain electrodes includes alignment displacement accommodating regions formed so as to include the source-drain electrodes individually.

(9) The semiconductor element according to any one of the above (2) to (8),
wherein the source-drain electrodes are formed of one of a conductive polymer, carbon, and a metal.

(10) A display device including:
a semiconductor element; and
a display layer;
wherein the semiconductor element includes
an organic semiconductor layer,
an electrode disposed on the organic semiconductor layer so as to be in contact with the organic semiconductor layer, and
a wiring layer formed separately from the electrode and electrically connected to the electrode.

(11) An electronic device including:
a display device having
a semiconductor element and
a display layer;
wherein the semiconductor element includes
an organic semiconductor layer,
an electrode disposed on the organic semiconductor layer so as to be in contact with the organic semiconductor layer, and
a wiring layer formed separately from the electrode and electrically connected to the electrode.

(12) A method for manufacturing a semiconductor element, the method including:
forming an organic semiconductor layer on a substrate;
forming an electrode on the organic semiconductor layer so as to be in contact with the organic semiconductor layer; and
forming a wiring layer electrically connected to the electrode after forming the electrode.

(13) The method for manufacturing the semiconductor element according to the above (12),
wherein the electrode is formed by using a printing process, and the wiring layer is formed by using a vacuum film forming process and photolithography technology.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A semiconductor element comprising:
an organic semiconductor layer;
an electrode disposed on said organic semiconductor layer so as to be in contact with said organic semiconductor layer; and
a wiring layer formed separately from said electrode and electrically connected to said electrode, wherein the semiconductor element includes
said organic semiconductor layer,
a gate electrode,
a pair of source-drain electrodes as said electrode, and said wiring layer, and
is formed as a thin film transistor,
a gate insulating film and
a protective film,
wherein said gate electrode, said gate insulating film, said organic semiconductor layer, said source-drain electrodes, said protective film, and said wiring layer are laminated on a substrate in order of said gate electrode, said gate insulating film, said organic semiconductor layer, said source-drain electrodes, said protective film, and said wiring layer, wherein said organic semiconductor layer has projection parts as regions overlapping said source-drain electrodes outside a region of formation of said protective film.

2. The semiconductor element according to claim 1, wherein said protective film has recessed parts as notch regions, and said organic semiconductor layer and said source-drain electrodes overlap each other in said notch regions.

3. The semiconductor element according to claim 1, wherein one of said organic semiconductor layer and said protective film is disposed in a region of overlap between said gate electrode and said wiring layer.

4. The semiconductor element according to claim 1, wherein an external shape line of said organic semiconductor layer is disposed on an inside of an external shape line of said gate electrode in a region connecting a pair of wiring layers as said wiring layer to each other, the pair of wiring layers being connected to said pair of source-drain electrodes, respectively.

5. The semiconductor element according to claim 1, wherein said pair of source-drain electrodes includes alignment displacement accommodating regions formed so as to include said source-drain electrodes individually.

6. The semiconductor element according to claim 1, wherein said source-drain electrodes are formed of one of a metal, a conductive polymer, and carbon.

7. A display device comprising:
a semiconductor element; and
a display layer;
wherein said semiconductor element includes
an organic semiconductor layer,
an electrode disposed on said organic semiconductor layer so as to be in contact with said organic semiconductor layer, and
a wiring layer formed separately from said electrode and electrically connected to said electrode, wherein the semiconductor element includes
said organic semiconductor layer,
a gate electrode,
a pair of source-drain electrodes as said electrode, and said wiring layer, and
is formed as a thin film transistor,
a gate insulating film and
a protective film,
wherein said gate electrode, said gate insulating film, said organic semiconductor layer, said source-drain electrodes, said protective film, and said wiring layer are laminated on a substrate in order of said gate electrode, said gate insulating film, said organic semiconductor layer, said source-drain electrodes, said protective film, and said wiring layer, wherein said organic semiconductor layer has projection parts as regions overlapping said source-drain electrodes outside a region of formation of said protective film.

8. The display device of claim 7, wherein said protective film has recessed parts as notch regions, and said organic semiconductor layer and said source-drain electrodes overlap each other in said notch regions.

9. The display device of claim 7, wherein one of said organic semiconductor layer and said protective film is disposed in a region of overlap between said gate electrode and said wiring layer.

10. The display device of claim 7, wherein an external shape line of said organic semiconductor layer is disposed on an inside of an external shape line of said gate electrode in a region connecting a pair of wiring layers as said wiring layer to each other, the pair of wiring layers being connected to said pair of source-drain electrodes, respectively.

11. The display device of claim 7, wherein said pair of source-drain electrodes includes alignment displacement accommodating regions formed so as to include said source-drain electrodes individually.

12. The display device of claim 7, wherein said source-drain electrodes are formed of one of a metal, a conductive polymer, and carbon.

13. An electronic device comprising:
a display device having
a semiconductor element and
a display layer;
wherein said semiconductor element includes
an organic semiconductor layer,
an electrode disposed on said organic semiconductor layer so as to be in contact with said organic semiconductor layer, and
a wiring layer formed separately from said electrode and electrically connected to said electrode, wherein the semiconductor element includes
said organic semiconductor layer
a gate electrode,
a pair of source-drain electrodes as said electrode, and said wiring layer, and
is formed as a thin film transistor,
a gate insulating film and
a protective film,
wherein said gate electrode, said gate insulating film, said organic semiconductor layer, said source-drain electrodes, said protective film, and said wiring layer are laminated on a substrate in order of said gate electrode, said gate insulating film, said organic semiconductor layer, said source-drain electrodes, said protective film, and said wiring layer, wherein said organic semiconductor layer has projection parts as regions overlapping said source-drain electrodes outside a region of formation of said protective film.

14. The electronic device of claim 13, wherein said protective film has recessed parts as notch regions, and said organic semiconductor layer and said source-drain electrodes overlap each other in said notch regions.

15. The electronic device of claim 13, wherein one of said organic semiconductor layer and said protective film is disposed in a region of overlap between said gate electrode and said wiring layer.

16. The electronic device of claim 13, wherein an external shape line of said organic semiconductor layer is disposed on an inside of an external shape line of said gate electrode in a region connecting a pair of wiring layers as said wiring layer to each other, the pair of wiring layers being connected to said pair of source-drain electrodes, respectively.

17. The electronic device of claim 13, wherein said pair of source-drain electrodes includes alignment displacement accommodating regions formed so as to include said source-drain electrodes individually.

18. The electronic device of claim 13, wherein said source-drain electrodes are formed of one of a metal, a conductive polymer, and carbon.

* * * * *